US012660421B2

(12) United States Patent
Kim

(10) Patent No.: US 12,660,421 B2
(45) Date of Patent: Jun. 16, 2026

(54) PIXEL, DISPLAY APPARATUS INCLUDING PIXEL, AND METHOD OF MANUFACTURING DISPLAY APPARATUS

(71) Applicant: Samsung Display Co., Ltd., Yongin-si (KR)

(72) Inventor: Keunwoo Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 464 days.

(21) Appl. No.: 18/303,327

(22) Filed: Apr. 19, 2023

(65) Prior Publication Data

US 2023/0403880 A1 Dec. 14, 2023

(30) Foreign Application Priority Data

Jun. 9, 2022 (KR) ........................ 10-2022-0070223

(51) Int. Cl.
| | |
|---|---|
| *H10K 59/121* | (2023.01) |
| *H10K 59/12* | (2023.01) |
| *H10K 59/131* | (2023.01) |
| *H10K 71/20* | (2023.01) |

(52) U.S. Cl.
CPC ..... *H10K 59/1213* (2023.02); *H10K 59/1201* (2023.02); *H10K 59/1216* (2023.02); *H10K 59/131* (2023.02); *H10K 71/233* (2023.02)

(58) Field of Classification Search
CPC ........... H10K 59/1213; H10K 59/1201; H10K 59/1216; H10K 59/131; H10K 71/233;

H10K 71/00; H10K 59/12; H10K 59/1315; G09G 3/3233; G09G 2300/0426; G09G 2300/043; G09G 2300/0842

See application file for complete search history.

(56) References Cited

U.S. PATENT DOCUMENTS

| | | |
|---|---|---|
| 7,491,591 B2 | 2/2009 | Choi |
| 9,917,198 B2 | 3/2018 | Xie |

(Continued)

FOREIGN PATENT DOCUMENTS

| | | |
|---|---|---|
| CN | 113363290 A | 9/2021 |
| KR | 10-0579188 B1 | 5/2006 |

(Continued)

*Primary Examiner* — Chad M Dicke
*Assistant Examiner* — Gary Abel
(74) *Attorney, Agent, or Firm* — Womble Bond Dickinson (US) LLP

(57) ABSTRACT

A display apparatus including a pixel. The pixel includes a capacitor connected to a first voltage line, a light emitting element connected to a second voltage line, a first transistor including a first gate electrode connected to the capacitor, a second transistor connected to a data line and including a second gate electrode connected to the first scan line, a third transistor including a third gate electrode connected to a second scan line, and a fourth transistor including a fourth gate electrode connected to a third scan line, wherein at least one of the third transistor or the fourth transistor includes a plurality of active areas spaced apart from each other with a common conductive area therebetween, wherein at least one of the third gate electrode or the fourth gate electrode overlaps each of the common conductive area and the plurality of active areas in a plan view.

20 Claims, 13 Drawing Sheets

(56) References Cited

U.S. PATENT DOCUMENTS

| 2003/0039146 A1* | 2/2003 | Choi | .................. G11C 16/0433 |
| | | | 257/E27.103 |
| 2021/0027739 A1* | 1/2021 | Kim | ...................... G09G 5/008 |
| 2021/0057502 A1* | 2/2021 | Kim | ...................... G09G 3/3266 |
| 2021/0280652 A1 | 9/2021 | Kim et al. | |
| 2021/0327344 A1* | 10/2021 | Dong | .................. G09G 3/3233 |
| 2021/0359058 A1 | 11/2021 | Cho et al. | |
| 2022/0319438 A1* | 10/2022 | Sun | ...................... H10D 86/481 |

FOREIGN PATENT DOCUMENTS

| KR | 10-2020-0012062 A | 2/2020 |
| KR | 10-2021-0113513 A | 9/2021 |

\* cited by examiner

S3    A3-1 SD3 A3-2    D3              S6    A6        D6

SP3                                    SP6

SMP:SP3,SP6

SP3    S3 A3-1 G3 SD3 G3 A3-2 D3              S6 A6 G6 D6

T3-1              T3-2                        T6

T3

SMP:SP3,SP6

SMP : SP3, SP6

PIXEL, DISPLAY APPARATUS INCLUDING PIXEL, AND METHOD OF MANUFACTURING DISPLAY APPARATUS

CROSS-REFERENCE TO RELATED APPLICATION

This application claims priority to and the benefit of Korean Patent Application No. 10-2022-0070223, filed on Jun. 9, 2022, in the Korean Intellectual Property Office, the entire contents of which are hereby incorporated by reference.

BACKGROUND

1. Field

The present disclosure relates to a pixel, a display apparatus including the pixel, and a method of manufacturing the display apparatus.

2. Description of Related Art

Display apparatuses such as televisions, mobile phones, tablets, navigation devices, and game machines may include a plurality of pixels that provide images to a user through a display screen. Each of the pixels may include a light emitting element generating light and a circuit unit controlling current flowing to the light emitting element. However, when leakage current occurs in the circuit unit of the pixel, the amount of current flowing to the light emitting element may be changed, and thus the display quality of the display apparatus may be deteriorated.

SUMMARY

Aspects of embodiments are directed toward a pixel that prevents deterioration of display quality and a display apparatus including the same.

Additional aspects will be set forth in part in the description which follows and, in part, will be apparent from the description, or may be learned by practice of the presented embodiments of the disclosure.

According to an embodiment of the present disclosure, a pixel includes: a capacitor connected to a first voltage line; a light emitting element connected to a second voltage line; a first transistor including a first gate electrode connected to the capacitor; a second transistor connected to a data line and including a second gate electrode connected to a first scan line; a third transistor including a third gate electrode connected to a second scan line; and a fourth transistor including a fourth gate electrode connected to a third scan line, wherein at least one of the third transistor or the fourth transistor includes a plurality of active areas spaced apart from each other with a common conductive area therebetween, wherein at least one of the third gate electrode or the fourth gate electrode overlaps each of the common conductive area and the plurality of active areas in a plan view.

In an embodiment, the first transistor may include a first electrode connected to the first voltage line and a second electrode connected to the light emitting element, and the second transistor may include a first electrode connected to the data line and a second electrode connected to the first electrode of the first transistor.

In an embodiment, the third transistor may include: a first common conductive area; a plurality of active areas spaced apart from each other with the first common conductive area therebetween; a first electrode connected to the first gate electrode; and a second electrode connected to the second electrode of the first transistor, wherein the first electrode and the second electrode of the third transistor may be spaced apart from each other with the plurality of active areas therebetween.

In an embodiment, the third gate electrode may overlap the plurality of active areas and the first common conductive area in a plan view.

In an embodiment, the third transistor and the fourth transistor may be P-type transistors.

In an embodiment, the first scan line and the second scan line may be integrally formed and transmit the same first scan signal.

In an embodiment, the first scan line and the second scan line may be configured to transmit a first scan signal and a second scan signal that are distinct from each other, respectively (i.e., the second scan is distinct from the first scan signal).

In an embodiment, the fourth transistor may include: a second common conductive area; a plurality of active areas spaced apart from each other with the second common conductive area therebetween; a first electrode connected to the first gate electrode; and a second electrode connected to a third voltage line for transmitting an initialization voltage, wherein the first electrode and the second electrode of the fourth transistor may be spaced apart from each other with the plurality of active areas therebetween.

In an embodiment, the fourth gate electrode may overlap the plurality of active areas and the second common conductive area in a plan view.

In an embodiment, the pixel may further include: a fifth transistor including a fifth gate electrode connected to an emission control line and electrically connected between the first voltage line and the first transistor; and a sixth transistor including a sixth gate electrode connected to the emission control line and electrically connected between the first transistor and the light emitting element.

In an embodiment, the pixel may further include a seventh transistor including a seventh gate electrode connected to the third scan line and electrically connected between a third voltage line transmitting an initialization voltage and the sixth transistor.

In an embodiment, the pixel may further include: a seventh transistor including a seventh gate electrode connected to a fourth scan line and electrically connected between a third voltage line transmitting an initialization voltage and the sixth transistor; and an eighth transistor including an eighth gate electrode connected to the fourth scan line and electrically connected between a fourth voltage line transmitting a bias voltage and the second transistor.

In an embodiment of the present disclosure, a display apparatus includes a plurality of pixels, wherein each of the plurality of pixels includes: a capacitor electrically connected to a first voltage line; a light emitting element electrically connected to a second voltage line; a driving transistor including a gate electrode connected to the capacitor and electrically connected between the first voltage line and the light emitting element; a switching transistor electrically connected between a data line and the driving transistor; a compensation transistor electrically connected between the gate electrode of the driving transistor and a semiconductor pattern of the driving transistor; and an initialization transistor electrically connected between the compensation transistor and a third voltage line, wherein at least one of the compensation transistor or the initialization transistor includes: a plurality of active areas spaced apart from each other with a common conductive area therebetween; and a gate electrode overlapping the common conductive area and the plurality of active areas in a plan view.

In an embodiment, each of the plurality of active areas may include polysilicon.

In an embodiment, the compensation transistor may include a semiconductor pattern and a gate electrode disposed on the semiconductor pattern, wherein the semiconductor pattern of the compensation transistor may include: a common conductive area; a plurality of active areas spaced apart from each other with the common conductive area therebetween; and a source area and a drain area spaced apart between the plurality of active areas. Each of the common conductive area, the source area, and the drain area of the compensation transistor may be doped with a dopant, and the gate electrode of the compensation transistor may overlap the plurality of active areas and the common conductive area in a plan view.

In an embodiment, the gate electrode of the compensation transistor may not overlap the source area and the drain area in a plan view.

In an embodiment, a doping concentration of each of the common conductive area, the source area, and the drain area may be equal to each other.

In an embodiment, doping concentrations of the common conductive area, the source area, and the drain area may be different from each other.

In an embodiment, a doping concentration of the common conductive area may be smaller than a doping concentration of each of the source area and the drain area.

In an embodiment of the present disclosure, a method of manufacturing a display apparatus is provided. The method includes: forming a preliminary semiconductor pattern on a base substrate; forming a photoresist layer on the preliminary semiconductor pattern; forming a photoresist pattern overlapping a half-transmissive area from the photoresist layer by providing a mask including a transmissive area and the half-transmissive area on the photoresist layer; forming a first semiconductor pattern and a second semiconductor pattern by doping the preliminary semiconductor pattern; and forming a first gate electrode and a second gate electrode on the first semiconductor pattern and the second semiconductor pattern, respectively, wherein the first semiconductor pattern includes a plurality of first active areas corresponding to the photoresist pattern and overlapping the first gate electrode, wherein the second semiconductor pattern includes a second active area corresponding to the photoresist pattern and overlapping the second gate electrode.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
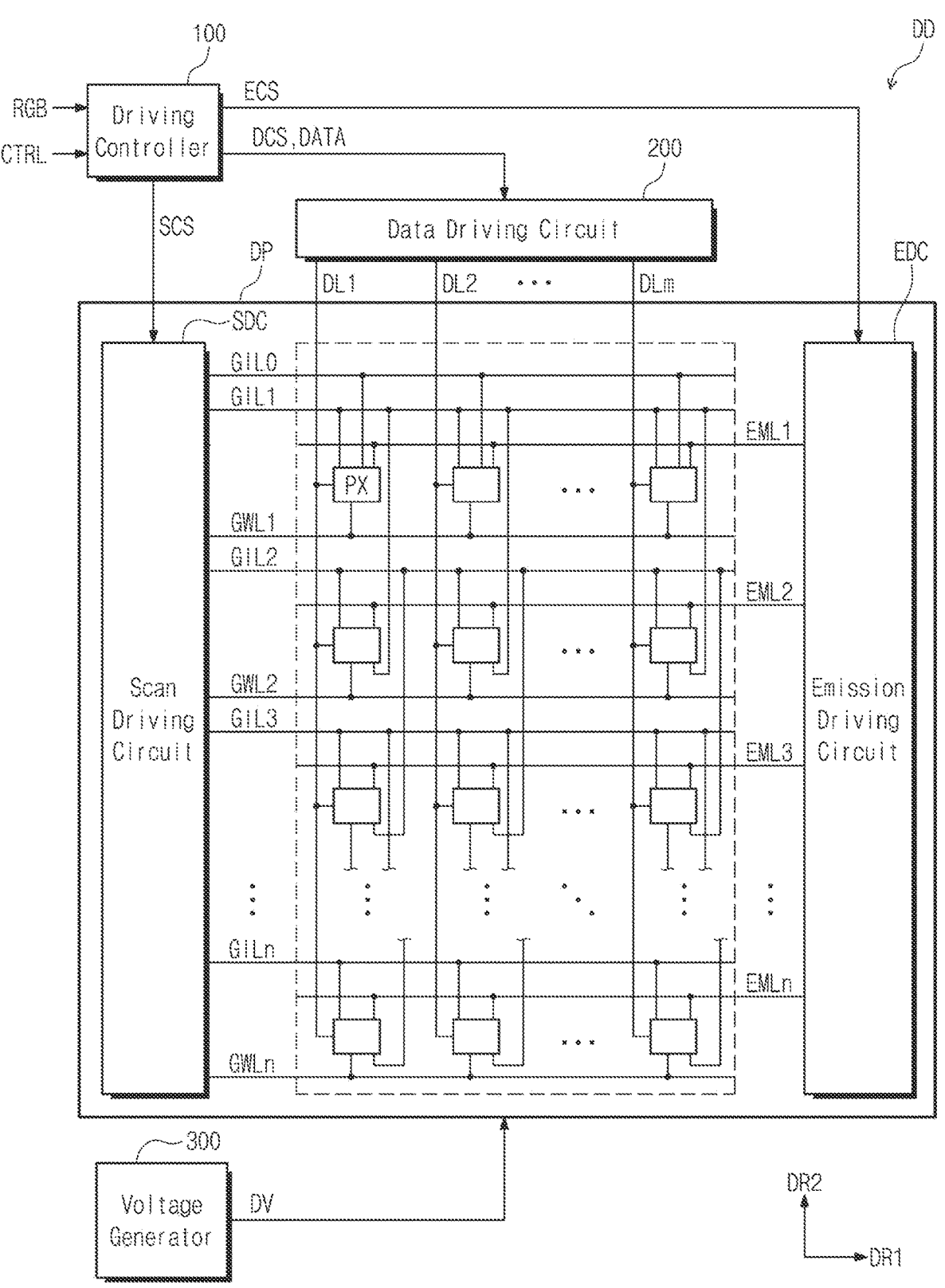
FIG. 1 is a block diagram of a display apparatus according to an embodiment of the present disclosure.

Because the present disclosure may have one or more suitable changes and may have one or more suitable forms, specific embodiments are illustrated in the drawings and described in more detail in the text. However, this is not intended to limit the present disclosure to specific embodiments, and should be understood to include all modifications, equivalents and substitutes included in the spirit and scope of the present disclosure.

In this specification, when an element (or region, layer, part, etc.) is referred to as being "on", "connected to", or "coupled to", or "adjacent to" another element, it refers to that it may be directly placed on/connected to/coupled to other components, or one or more third components may be arranged between them. That is, it should be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present.

Like reference numerals refer to like elements. Additionally, in the drawings, the thicknesses, proportions, and dimensions of components are exaggerated for effective description. "And/or" includes all of one or more combinations defined by related components. Further, the use of "may" when describing embodiments of the present disclosure refers to "one or more embodiments of the present disclosure."

It will be understood that the terms "first" and "second" are utilized herein to describe one or more suitable components but these components should not be limited by these terms. The above terms are utilized only to distinguish one component from another. For example, a first component may be referred to as a second component and vice versa without departing from the scope of the present disclosure. The terms of a singular form may include plural forms unless otherwise specified.

In some embodiments, terms such as "below", "the lower side", "on", and "the upper side" are utilized to describe a relationship of components shown in the drawing. The terms are described as a relative concept based on a direction shown in the drawing.

In one or more suitable embodiments of the present disclosure, the term "include," "comprise," "including," or "comprising," specifies a property, a region, a fixed number, a step, a process, an element and/or a component but does not exclude other properties, regions, fixed numbers, steps, processes, elements and/or components. Also, as used herein, the singular forms "a", "an" and "the" are intended to include the plural forms as well, unless the context clearly indicates otherwise.

In the present specification, "including A or B", "A and/or B", etc., represents A or B, or A and B.

Throughout the disclosure, the expression "at least one of a, b or c", "at least one of a-c", "at least one of a to c", "at least one of a, b, and/c", etc., indicates only a, only b, only c, both (e.g., simultaneously) a and b, both (e.g., simultaneously) a and c, both (e.g., simultaneously) b and c, all of a, b, and c, or variations thereof.

As used herein, the term "substantially," "about," and similar terms are used as terms of approximation and not as terms of degree, and are intended to account for the inherent deviations in measured or calculated values that would be recognized by those of ordinary skill in the art.

The display apparatus and/or any other relevant devices or components according to embodiments of the present invention described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the [device] may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Unless otherwise defined, all terms (including technical and scientific terms) utilized herein have the same meaning as commonly understood by one of ordinary skill in the art to which this present disclosure belongs. In some embodiments, terms such as terms defined in commonly utilized dictionaries should be interpreted as having a meaning consistent with the meaning in the context of the related technology, and it should not be construed in an overly ideal or overly formal sense unless explicitly defined here.

Hereinafter, a pixel and a display apparatus according to an embodiment of the present disclosure will be described with reference to the drawings.

FIG. 1 is a block diagram of a display apparatus according to an embodiment of the present disclosure.

The display apparatus DD may be a device that is activated according to an electrical signal and displays an image. For example, the display apparatus DD may be a large device such as a television or an external billboard, or a small or medium-sized device such as a monitor, a mobile phone, a tablet, a navigation device, a game machine, and/or the like. On the other hand, the embodiments of the display apparatus DD are examples and are not limited to any one unless departing from the concept of the present disclosure.

Referring to FIG. 1, the display apparatus DD may include a display panel DP, a driving controller 100, a data driving circuit 200, and a voltage generator 300. Each of the driving controller 100 and the data driving circuit 200 may be provided in the form of a driving chip or may be directly formed on the display panel DP without being limited thereto.

The driving controller 100 may receive an image input signal RGB and a control signal CTRL. The image input signal RGB and the control signal CTRL may be provided from a main controller (or graphic processor).

The driving controller 100 may generate an image data signal DATA obtained by converting the data format of the image input signal RGB to meet the interface specification with the data driving circuit 200. The driving controller 100 may output a scan control signal SCS, a data control signal DCS, and an emission control signal ECS.

The data driving circuit 200 may receive the data control signal DCS and the image data signal DATA from the driving controller 100. The data driving circuit 200 may convert the image data signal DATA into data signals, and output the data signals to a plurality of data lines DL1 to DLm, which will be described later. The data signals may be analog voltages corresponding to the grayscale value of the image data signal DATA.

The voltage generator 300 may generate voltages necessary for the operation of the display panel DP. In an embodiment, the voltage generator 300 may generate driving voltages DV. The driving voltages DV may include a plurality of voltages having different voltage levels. For example, the driving voltages DV may include a first driving voltage ELVDD (refer to FIG. 2A), a second driving voltage ELVSS (refer to FIG. 2A), and an initialization voltage VINT (refer to FIG. 2A) to be described later. However, embodiments of the driving voltages DV are not limited thereto.

The display panel DP according to an embodiment of the present disclosure may be a light emitting display panel, but is not particularly limited. For example, the display panel DP may be an organic light emitting display panel, an inorganic light emitting display panel, or a quantum dot light emitting display panel. The light emitting layer of the organic light emitting display panel may include an organic light emitting material, and the light emitting layer of the inorganic light emitting display panel may include an inorganic light emitting material. The light emitting layer of the quantum dot light emitting display panel may include a quantum dot and a quantum rod. Hereinafter, the display panel DP is described as the organic light emitting display panel.

The display panel DP may include first scan lines GIL0 to GILn, second scan lines GWL1 to GWLn, emission control lines EML1 to EMLn, data lines DL1 to DLm, and pixels PX. The display panel DP may include a scan driving circuit SDC and an emission driving circuit EDC directly formed on the display panel DP. However, the present disclosure is not limited thereto, and the scan driving circuit SDC and the emission driving circuit EDC may be provided in the form of a driving chip.

In one embodiment shown in FIG. 1, the scan driving circuit SDC and the emission driving circuit EDC are disposed with the pixels PX therebetween and are provided as separate driving circuits that are distinguished from each other, but embodiments of the present disclosure are not limited thereto. For example, the scan driving circuit SDC and the emission driving circuit EDC may be configured as one driving circuit.

The first scan lines GIL0 to GILn and the second scan lines GWL1 to GWLn may extend along the first direction DR1 to be connected to the scan driving circuit SDC. The emission control lines EML1 to EMLn may extend along the first direction DR1 to be connected to the emission driving circuit EDC. The first scan lines GIL0 to GILn, the second scan lines GWL1 to GWLn, and the emission control lines EML1 to EMLn may be arranged to be spaced apart from each other in the second direction DR2.

The data lines DL1 to DLm may extend along the second direction DR2 to be connected to the data driving circuit 200. The data lines DL1 to DLm may be arranged to be spaced apart from each other in the first direction DR1.

The plurality of pixels PX are electrically connected to the first scan lines GIL0 to GILn, the second scan lines GWL1 to GWLn, the emission control lines EML1 to EMLn, and the data lines DL1 to DLm, respectively. For example, in the embodiment illustrated in FIG. 1, the pixels PX in the first row may be connected to three scan lines GIL0, GIL1, and GWL1 and one emission control line EML1. However, this is an example, and the type and number of signal lines connected to the pixels PX are not limited thereto.

The scan driving circuit SDC may receive the scan control signal SCS from the driving controller 100. The scan driving circuit SDC may output first scan signals to the first scan lines GIL0 to GILn and may output second scan signals to the second scan lines GWL1 to GWLn in response to the scan control signal SCS.

The emission driving circuit EDC may receive an emission control signal ECS from the driving controller 100. The emission driving circuit EDC may output emission signals to the emission control lines EML1 to EMLn in response to the emission control signal ECS.

Figure 2A:
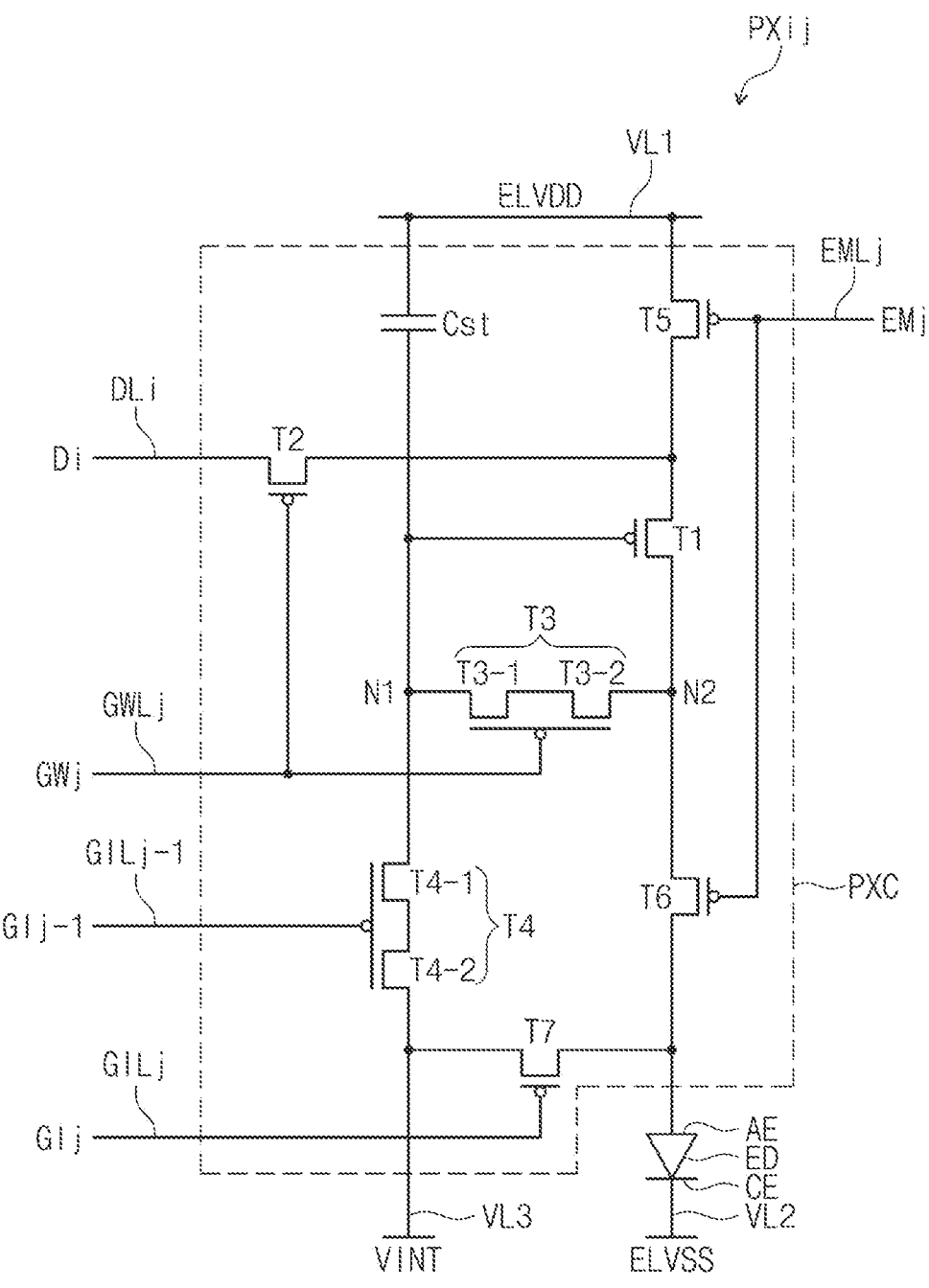
FIGS. 2A and 2B are equivalent circuit diagrams of a pixel according to an embodiment of the present disclosure.

Each of the pixels PX constituting the display panel DP may include the light emitting element ED (refer to FIG. 2A) and the circuit unit PXC (refer to FIG. 2A) for controlling light emission of the light emitting element ED (refer to FIG. 2A). The circuit unit PXC (refer to FIG. 2A) may include a plurality of transistors and at least one capacitor. At least one of the scan driving circuit SDC or the emission driving circuit EDC may include transistors formed through the same process as the circuit unit PXC (refer to FIG. 2A) of the pixels PX.

The pixels PX may receive data voltages in response to scan signals. The pixels PX may display an image by emitting light having luminance corresponding to the data voltages in response to emission signals. The emission time of the pixels PX may be controlled or selected by the emission signals. Accordingly, the display panel DP may output the image through the pixels PX.

The pixels PX may include a plurality of groups generating light of different colors. For example, the pixels PX may include red pixels generating red light, green pixels generating green light, and blue pixels generating blue light. Each of light emitting layers of a red pixel light emitting element, a green pixel light emitting element, and a blue pixel light emitting element may be formed of different materials. However, the embodiment is not necessarily limited thereto.

Figure 2B:
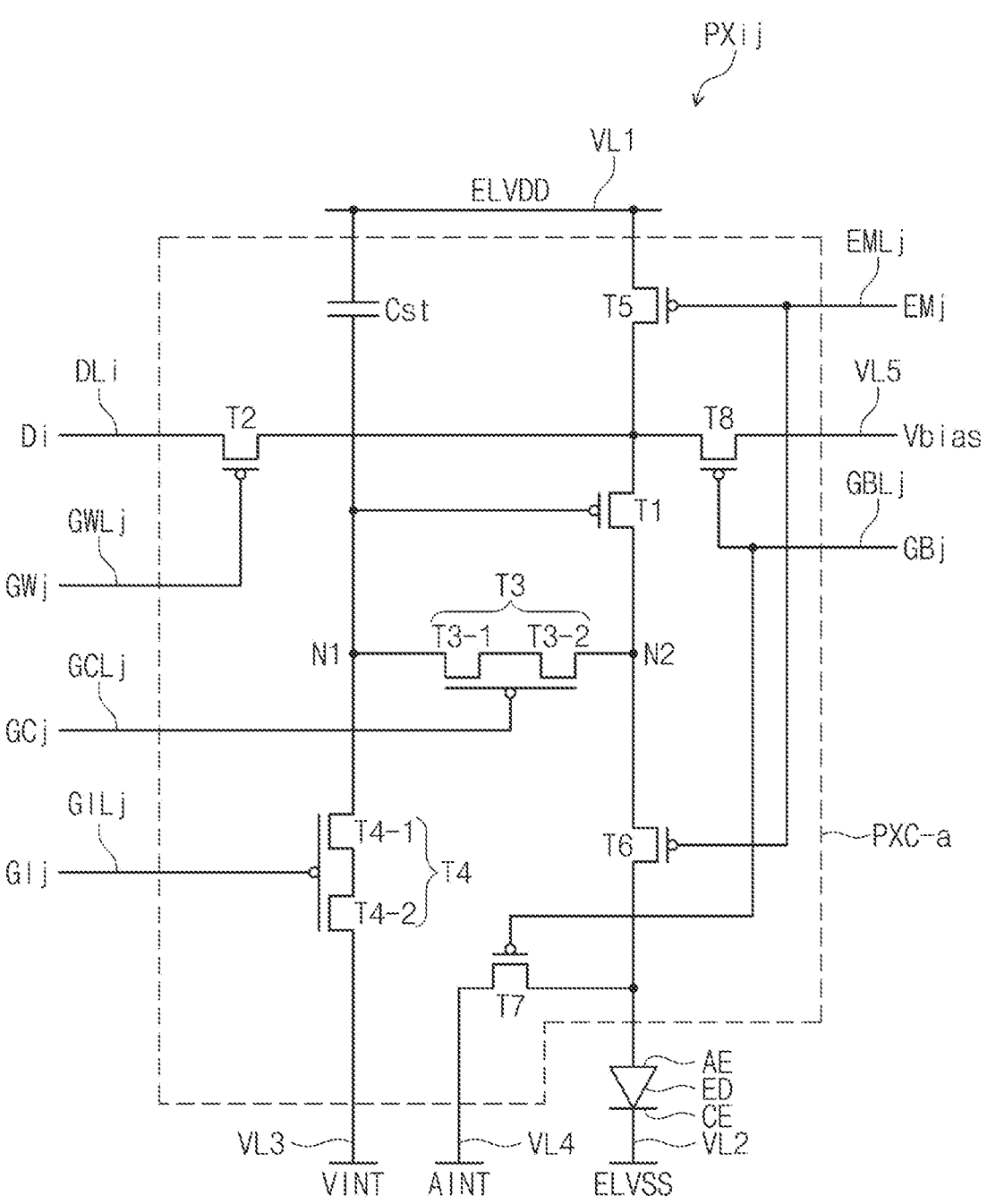

FIGS. 2A and 2B are equivalent circuit diagrams of a pixel according to an embodiment of the present disclosure.

FIG. 2A exemplarily shows an equivalent circuit diagram of the pixel PXij connected to the i-th data line DLi among the data lines DL1 to DLm, the (j−1)-th first scan line GILj−1 and the j-th first scan line GILj among the first scan lines GIL0 to GILn, the j-th second scan line GWLj among the second scan lines GWL1 to GWLn, and the j-th emission control line EMLj among the emission control lines EML1 to EMLn shown in FIG. 1. Here, i and j represent natural numbers.

Referring to FIG. 2A, the pixel PXij may include a light emitting element ED and a circuit unit PXC connected to the light emitting element ED. The circuit unit PXC may control the amount of current flowing through the light emitting element ED, and the light emitting element ED may be configured to emit light having a luminance according to the received current amount.

The circuit unit PXC may include first to seventh transistors T1 to T7 and a capacitor Cst. Each of the first to seventh transistors T1 to T7 is a P-type or kind transistor (e.g., a P-channel transistor) including a low-temperature polycrystalline silicon (LTPS) semiconductor layer. However, the embodiment is not limited thereto, and each of the first to seventh transistors T1 to T7 may be a transistor including an oxide semiconductor layer. Also, each of the first to seventh transistors T1 to T7 may be a P-type or kind transistor or an N-type or kind transistor (e.g., an N-channel transistor). In this embodiment, although each of the first to seventh transistors T1 to T7 is illustrated as a P-type or kind transistor having a low-temperature polycrystalline silicon (LTPS) semiconductor layer, this is an example, and at least one of the first to seventh transistors T1 to T7 may be an N-type or kind transistor having an oxide semiconductor layer, but is not limited thereto.

The (j−1)-th first scan line GILj−1, the j-th first scan line GILj, the j-th second scan line GWLj, and the j-th emission control line EMLj may be configured to transmit a (j−1)-th first scan signal GIj−1, a j-th first scan signal GIj, a j-th second scan signal GWj, and an emission signal EMj, respectively. The i-th data line DLi may be configured to transmit the data signal Di. The data signal Di may have a voltage level corresponding to the image input signal RGB (refer to FIG. 1) input to the display apparatus DD (refer to FIG. 1). The first to third voltage lines VL1, VL2, and VL3 may be configured to transmit a first driving voltage ELVDD, a second driving voltage ELVSS, and an initialization voltage VINT, respectively.

In this embodiment, the light emitting element ED may be an organic light emitting element. The light emitting element ED may include an anode AE and a cathode CE. The anode AE of the light emitting element ED may be electrically connected to the first voltage line VL1 through which the first driving voltage ELVDD is transmitted via at least one transistor, and the cathode CE of the light emitting element ED may be electrically connected to the second voltage line VL2 to which the second driving voltage ELVSS is transmitted.

Each of the first to seventh transistors T1 to T7 may include a first electrode, a second electrode, and a gate electrode. According to an embodiment of the present disclosure, the first electrode and the second electrode may be defined as an input electrode or an output electrode (or a source electrode or a drain electrode), respectively. In this specification, "electrically connected between a transistor and a signal line or a transistor and a transistor" refers to "the electrode of the transistor has an integral shape with the signal line or is connected through a connection electrode".

The first transistor T1 may be electrically connected between the first voltage line VL1 and the anode AE of the light emitting element ED. The first transistor T1 may include a first electrode connected to the first voltage line VL1 via the fifth transistor T5, a second electrode electrically connected to the anode AE of the light emitting element ED via the sixth transistor T6, and a gate electrode connected to the capacitor Cst. The first transistor T1 may receive the data signal Di transmitted from the data line DLi according to the switching operation of the second transistor T2 and supply the driving current to the light emitting element ED. In this embodiment, the first transistor T1 may be defined as a driving transistor.

The second transistor T2 may be connected between the data line DLi and the first electrode of the first transistor T1. The second transistor T2 may include a first electrode connected to the data line DLi, a second electrode connected to the first electrode of the first transistor T1, and a gate electrode connected to the j-th second scan line GWLj. The second transistor T2 may be turned on according to the second scan signal GWj received through the j-th second scan line GWLj and transmit the data signal Di transmitted from the data line DLi to the first electrode of the first transistor T1. In this embodiment, the second transistor T2 may be defined as a switching transistor.

The third transistor T3 may be electrically connected between the second electrode of the first transistor T1 and the gate electrode of the first transistor T1. The third transistor T3 may include a first electrode connected to a first node N1, a second electrode connected to a second node N2, and a gate electrode connected to the j-th second scan line GWLj. For example, the first electrode of the third transistor T3 may be connected to the first node N1 connected to the gate electrode of the first transistor T1, and the second electrode of the third transistor T3 may be connected to the second node N2 connected to the second electrode of the first transistor T1.

The third transistor T3 may be turned on according to the second scan signal GWj received through the j-th second scan line GWLj and may electrically connect the gate electrode of the first transistor T1 and the second electrode of the first transistor T1. For example, the first transistor T1 may be diode-connected by the third transistor T3. In this embodiment, the third transistor T3 may be defined as a compensation transistor.

The third transistor T3 may include first and second sub-transistors T3-1 and T3-2. The first and second sub-transistors T3-1 and T3-2 may be connected in series between the first node N1 and the second node N2.

The first sub-transistor T3-1 may include a first electrode connected to the first node N1, a second electrode connected to the second sub-transistor T3-2, and a gate electrode connected to the second scan line GWLj. The first electrode of the first sub-transistor T3-1 may correspond to the first electrode of the third transistor T3. The second sub-transistor T3-2 may include a first electrode connected to the first sub-transistor T3-1, a second electrode connected to the second node N2, and a gate electrode connected to the second scan line GWLj. The second electrode of the second sub-transistor T3-2 may correspond to the second electrode of the third transistor T3.

In this embodiment, the second electrode of the first sub-transistor T3-1 and the first electrode of the second sub-transistor T3-2 may be provided as a common integral body. The first and second sub-transistors T3-1 and T3-2 may be connected in series through a common source/drain area (or a common conductive area) which is disposed between the first and second electrodes of the third transistor T3 and is formed on the same layer as the first and second electrodes of the third transistor T3. The common source/drain area (or common conductive area) may correspond to the second electrode of the first sub-transistor T3-1 and concurrently (e.g., simultaneously) correspond to the first electrode of the second sub-transistor T3-2.

In this embodiment, the gate electrode of the third transistor T3 may be provided as a single electrode. For example, the gate electrode of the first sub-transistor T3-1 and the gate electrode of the second sub-transistor T3-2 may be provided as a common single electrode. The gate electrodes of the first and second sub-transistors T3-1 and T3-2 may overlap the respective active areas of the first and second sub-transistors T3-1 and T3-2, and the common source/drain area positioned between the active areas of the first and second sub-transistors T3-1 and T3-2. Because of this, it is possible to remove the floating node formed in the common source/drain area, and minimize or reduce a phenomenon in which a voltage instantaneously increases between the first and second sub-transistors T3-1 and T3-2 by the floating node. Accordingly, the flow of leakage current through the third transistor T3 may be minimized or reduced and display quality of the display apparatus may be improved.

Although the third transistor T3 in FIG. 2A exemplarily includes two sub-transistors T3-1 and T3-2 connected in series, in an embodiment of the present disclosure, the transistor includes a common single gate electrode overlapping the active areas and common source/drain area of the sub-transistors but the embodiment of the present disclosure is not limited thereto. For example, the third transistor T3 may include (e.g., consist of) three or more sub-transistors connected in series between the first node N1 and the second node N2 and having a common gate electrode.

The fourth transistor T4 may be electrically connected between the first node N1 and the third voltage line VL3. The fourth transistor T4 may include a first electrode connected to the first node N1, a second electrode connected to a third voltage line VL3 to which the initialization voltage VINT is transmitted, and a gate electrode connected to the (j−1)-th first scan line GILj−1.

The fourth transistor T4 is turned on according to the first scan signal GIj−1 received through the (j−1)-th first scan line GILj−1 and transfers the initialization voltage VINT to the gate electrode of the first transistor T1 connected to the first node N1 to initialize the voltage of the gate electrode of the first transistor T1. In this embodiment, the fourth transistor T4 may be defined as an initialization transistor.

The fourth transistor T4 may include third and fourth sub-transistors T4-1 and T4-2. The third and fourth sub-transistors T4-1 and T4-2 may be connected in series between the first node N1 and the third voltage line VL3.

The third sub-transistor T4-1 may include a first electrode connected to the first node N1, a second electrode connected to the fourth sub-transistor T4-2, and a gate electrode connected to the first scan line GILj−1. The first electrode of the third sub-transistor T4-1 may correspond to the first electrode of the fourth transistor T4. The fourth sub-transistor T4-2 may include a first electrode connected to the third sub-transistor T4-1, a second electrode connected to the third voltage line VL3, and a gate electrode connected to the first scan line GILj−1. The second electrode of the fourth sub-transistor T4-2 may correspond to the second electrode of the fourth transistor T4.

In this embodiment, the second electrode of the third sub-transistor T4-1 and the first electrode of the fourth sub-transistor T4-2 may be provided as a common integral body. The third and fourth sub-transistors T4-1 and T4-2 may be connected in series through a common source/drain area (or a common conductive area) which is disposed between the first and second electrodes of the fourth transistor T4 and is formed on the same layer as the first and second electrodes of the fourth transistor T4. The common source/drain area (or common conductive area) may correspond to the second electrode of the third sub-transistor T4-1 and concurrently (e.g., simultaneously) correspond to the first electrode of the fourth sub-transistor T4-2.

In this embodiment, the gate electrode of the fourth transistor T4 may be provided as a single electrode. For example, the gate electrode of the third sub-transistor T4-1 and the gate electrode of the fourth sub-transistors T4-2 may be provided as a common single electrode. The gate electrodes of the third and fourth sub-transistors T4-1 and T4-2 may overlap the respective active areas of the third and fourth sub-transistors T4-1 and T4-2 and the common source/drain area positioned between the active areas of the third and fourth sub-transistors T4-1 and T4-2. Because of this, it is possible to remove the floating node formed in the common source/drain area, and minimize or reduce a phenomenon in which a voltage instantaneously increases between the third and fourth sub-transistors T4-1 and T4-2 by the floating node. Accordingly, the flow of leakage current through the fourth transistor T4 may be minimized or reduced and display quality of the display apparatus may be improved.

Although FIG. 2A illustrates that the fourth transistor T4 includes two sub-transistors T4-1 and T4-2 connected in series, the embodiment of the present disclosure is not limited thereto. For example, the fourth transistor T4 may include (e.g., consist of) only one transistor connected between the first node N1 and the third voltage line VL3, or may include (e.g., consist of) three or more sub-transistors connected in series with each other having a common single gate electrode.

The fifth transistor T5 may be electrically connected between the first voltage line VL1 and the first transistor T1. The fifth transistor T5 may include a first electrode connected to the first voltage line VL1, a second electrode connected to the first electrode of the first transistor T1, and a gate electrode connected to the emission control line EMLj.

The sixth transistor T6 may be electrically connected between the first transistor T1 and the light emitting element ED. The sixth transistor T6 may include a first electrode connected to the second electrode of the first transistor T1, a second electrode connected to the anode AE of the light emitting element ED, and a gate electrode connected to the emission control line EMLj.

The fifth transistor T5 and the sixth transistor T6 may be turned on according to the emission signal EMj transmitted through the j-th emission control line EMLj. The emission time of the light emitting element ED may be controlled or selected by the emission signal EMj. In this embodiment, the fifth transistor T5 and the sixth transistor T6 may be defined as light emission control transistors.

When the fifth transistor T5 and the sixth transistor T6 are turned on, a driving current may be generated according to a voltage difference between the gate voltage of the gate electrode of the first transistor T1 and the first driving voltage ELVDD, and the driving current may be supplied to the light emitting element ED through the sixth transistor T6 so that the light emitting element ED may be configured to emit light.

The seventh transistor T7 may be electrically connected between the fourth transistor T4 and the sixth transistor T6. The seventh transistor T7 may include a first electrode connected to the second electrode of the fourth transistor T4, a second electrode connected to the second electrode of the sixth transistor T6, and a gate electrode connected to the j-th first scan line GILj. In this embodiment, the seventh transistor T7 may be defined as an initialization transistor.

The seventh transistor T7 may be turned on according to the j-th first scan signal GILj transmitted through the j-th first scan line GILj. By the seventh transistor T7, a portion of the driving current may escape through the seventh transistor T7 as a bypass current. A portion of the minimum current of the first transistor T1 for displaying a black image flows as the bypass current by the seventh transistor T7 through other than the light emitting element ED, so that the black image of the light emitting element ED may be clearly expressed. For example, by realizing an accurate black luminance image by the seventh transistor T7, the contrast ratio of the display apparatus DD (refer to FIG. 1) may be improved. In an embodiment, the j-th first scan signal GILj of a low level may turn on the seventh transistor T7 as a bypass signal, but the embodiment of the present disclosure is not limited thereto.

The capacitor Cst may include a first electrode connected to the first voltage line VL1 transmitting the first driving voltage ELVDD and a second electrode connected to the first node N1. A charge corresponding to a voltage difference between the first electrode and the second electrode may be stored in the capacitor Cst. When the fifth and sixth transistors T5 and T6 are turned on, the amount of current flowing through the first transistor T1 may be determined according to the voltage stored in the capacitor Cst.

Referring to FIG. 2B, the pixel PXij may include a light emitting element ED and a circuit unit PXC-a connected to the light emitting element ED. FIG. 2B exemplarily shows an equivalent circuit diagram of the pixel PXij including the circuit unit PXC-a according to an embodiment, which is partially different from that of the circuit unit PXC shown in FIG. 2A.

FIG. 2B exemplarily shows the equivalent circuit diagram of the pixel PXij connected to the i-th data line DLi among the data lines DL1 to DLm, a j-th first scan line GILj among the first scan lines GIL0 to GILn, a j-th second scan line GWLj among the second scan lines GWL1 to GWLn, a j-th third scan line GCLj among the third scan lines, a j-th fourth scan line GBLj among the fourth scan lines, and a j-th emission control line EMLj among the emission control lines EML1 to EMLn.

Referring to FIG. 2B, the circuit unit PXC-a may include first to eighth transistors T1 to T8 and a capacitor Cst. Each of the first to eighth transistors T1 to T8 may be a P-type or kind transistor having a low-temperature polycrystalline silicon (LTPS) semiconductor layer, but is not limited thereto, and may be an N-type or kind transistor having an oxide semiconductor layer. In some embodiments, at least one of the first to eighth transistors T1 to T8 may be an N-type or kind transistor, and the rest may be a P-type or kind transistor.

The j-th first scan line GILj, the j-th second scan line GWLj, the j-th third scan line GCLj, the j-th fourth scan line GBLj, and the j-th emission control line EMLj may be configured to transmit the j-th first scan signal GIj, the j-th second scan signal GWj, the j-th third scan signal GCj, the j-th fourth scan signal GBj, and the emission signal EMj, respectively. The i-th data line DLi may be configured to transmit the data signal Di. The first to fifth voltage lines VL1, VL2, VL3, VL4, and VL5 may be configured to transmit the first driving voltage ELVDD, the second driving voltage ELVSS, the first initialization voltage VINT, the second initialization voltage AINT, and the bias voltage Vbias, respectively.

In this embodiment, the light emitting element ED may be an organic light emitting element including an anode AE and a cathode CE. The anode AE of the light emitting element ED may be electrically connected to the first voltage line VL1 to which the first driving voltage ELVDD is transmitted, and the cathode CE of the light emitting element ED may be electrically connected to the second voltage line VL2 to which the second driving voltage ELVSS is transmitted.

The first transistor T1 may include a first electrode electrically connected to the first voltage line VL1 via the fifth transistor T5, a second electrode electrically connected to the anode AE of the light emitting element ED via the sixth transistor T6, and a gate electrode electrically connected to the capacitor Cst. The first transistor T1 may receive the data signal Di transmitted from the data line DLi according to the switching operation of the second transistor T2 and supply the driving current to the light emitting element ED.

The second transistor T2 may include a first electrode connected to the data line DLi, a second electrode connected to the first electrode of the first transistor T1, and a gate electrode connected to the j-th second scan line GWLj. The second transistor T2 may be turned on according to the second scan signal GWj received through the j-th second scan line GWLj and transmit the data signal Di transmitted from the data line DLi to the first electrode of the first transistor T1.

The third transistor T3 may include first and second sub-transistors T3-1 and T3-2 connected in series between a first node N1 and a second node N2. A first electrode of the first sub-transistor T3-1 may be connected to the first node N1 connected to the gate electrode of the first transistor T1. The second electrode of the second sub-transistor T3-2 may be connected to the second node N2 connected to the second electrode of the first transistor T1. The first electrode of the first sub-transistor T3-1 may correspond to the first electrode of the third transistor T3, and the second electrode of the second sub-transistor T3-2 may correspond to the second electrode of the third transistor T3. The first and second sub-transistors T3-1 and T3-2 may be connected in series through a common source/drain area (or a common conductive area).

The third transistor T3 may include a gate electrode connected to the j-th third scan line GCLj. The third transistor T3 may be turned on according to the third scan signal GCj received through the j-th third scan line GCLj and may electrically connect the gate electrode of the first transistor T1 and the second electrode of the first transistor T1.

The gate electrode of the third transistor T3 may be provided as a common single electrode. For example, the gate electrode of the third transistor T3 may overlap the respective active areas of the first and second sub-transistors T3-1 and T3-2, and the common source/drain area positioned between the active areas of the first and second sub-transistors T3-1 and T3-2. Through this, a floating node formed in the common source/drain area may be removed to minimize or reduce a phenomenon in which a voltage instantaneously increases between the first and second sub-transistors T3-1 and T3-2. Accordingly, it is possible to improve the display quality of the display apparatus by minimizing or reducing the leakage current flowing through the third transistor T3.

The fourth transistor T4 may include third and fourth sub-transistors T4-1 and T4-2 connected in series between the first node N1 and the third voltage line VL3 to which the first initialization voltage VINT is transmitted. A first electrode of the third sub-transistor T4-1 may be connected to the first node N1. The second electrode of the fourth sub-transistor T4-2 may be connected to the third voltage line VL3. The first electrode of the third sub-transistor T4-1 may correspond to the first electrode of the fourth transistor T4, and the second electrode of the fourth sub-transistor T4-2 may correspond to the second electrode of the fourth transistor T4. The third and fourth sub-transistors T4-1 and T4-2 may be connected in series through a common source/drain area (or a common conductive area).

The fourth transistor T4 may include a gate electrode connected to the j-th first scan line GILj. The fourth transistor T4 is turned on according to the first scan signal GIj received through the j-th first scan line GILj and transfers the first initialization voltage VINT to the gate electrode of the first transistor T1 connected to the first node N1 to initialize the voltage of the gate electrode of the first transistor T1.

The gate electrode of the fourth transistor T4 may be provided as a common single electrode to overlap the respective active areas of the third and fourth sub-transistors T4-1 and T4-2, and the common source/drain area positioned between the active areas of the third and fourth sub-transistors T4-1 and T4-2. Through this, the floating node formed in the common source/drain area may be removed to minimize or reduce a phenomenon in which a voltage instantaneously increases between the third and fourth sub-transistors T4-1 and T4-2. Accordingly, it is possible to improve the display quality of the display apparatus by minimizing or reducing the leakage current flowing through the fourth transistor T4.

The fifth transistor T5 may include a first electrode connected to the first voltage line VL1, a second electrode connected to the first electrode of the first transistor T1, and a gate electrode connected to the emission control line EMLj.

The sixth transistor T6 may include a first electrode connected to the second electrode of the first transistor T1, a second electrode connected to the anode AE of the light emitting element ED, and a gate electrode connected to the emission control line EMLj.

The fifth transistor T5 and the sixth transistor T6 may be turned on according to the emission signal EMj transmitted through the j-th emission control line EMLj. When the fifth transistor T5 and the sixth transistor T6 are turned on, a driving current may be generated according to a voltage difference between the gate voltage of the gate electrode of the first transistor T1 and the first driving voltage ELVDD, and the driving current may be supplied to the light emitting element ED through the sixth transistor T6 so that the light emitting element ED may be configured to emit light.

The seventh transistor T7 may include a first electrode connected to the fourth voltage line VL4, a second electrode connected to the second electrode of the sixth transistor T6, and a gate electrode connected to the j-th fourth scan line GBLj.

The eighth transistor T8 may include a first electrode connected to the fifth voltage line VL5, a second electrode connected to the first electrode of the first transistor T1, and a gate electrode connected to the j-th fourth scan line GBLj.

The seventh transistor T7 and the eighth transistor T8 may be turned on according to the fourth scan signal GBj transmitted through the j-th fourth scan line GBLj. In this embodiment, the seventh transistor T7 and the eighth transistor T8 may be defined as initialization transistors.

As the seventh transistor T7 is turned on, the second initialization voltage AINT may be provided to the anode AE of the light emitting element ED. The seventh transistor T7 may bypass the anode AE of the light emitting element ED. For example, the seventh transistor T7 may prevent or reduce the light emitting element ED from emitting light with high luminance instantaneously due to a voltage remaining in the anode AE at the initial stage of driving the light emitting element ED.

The second initialization voltage AINT may have a different level from the first initialization voltage VINT. For example, the second initialization voltage AINT may have a lower level than the first initialization voltage VINT. However, when an optimal or suitable initialization voltage for removing the voltage remaining in the light emitting element ED may be provided, the embodiment is not limited to any one voltage.

As the eighth transistor T8 is turned on, the bias voltage Vbias may be applied to the first electrode of the first transistor T1. The bias voltage Vbias may have a set or predetermined level. The first transistor T1 may exhibit a hysteresis characteristic in which a driving current by a signal applied in the current frame driving period is affected by a signal applied in a previous frame driving period. For example, when the driving frequency is changed, the luminance change may be visually recognized by the user due to the hysteresis characteristic of the first transistor T1. However, as the eighth transistor T8 provides the bias voltage Vbias to the first electrode of the first transistor T1, the luminance change due to the hysteresis characteristic may be minimized or reduced and the display quality of the display apparatus may be improved.

The capacitor Cst may include a first electrode connected to the first voltage line VL1 transmitting the first driving voltage ELVDD and a second electrode connected to the first node N1. A charge corresponding to a voltage difference between the first electrode and the second electrode may be stored in the capacitor Cst. When the fifth and sixth transistors T5 and T6 are turned on, the amount of current flowing through the first transistor T1 may be determined according to the voltage stored in the capacitor Cst.

Each of the plurality of pixels PX illustrated in FIG. 1 may have the same circuit configuration as the equivalent circuit diagram of the pixel PXij illustrated in FIG. 2A or 2B. However, the embodiment of the pixels PXij is not limited to the illustrated example, and the number or connection structure of transistors and capacitors included in the circuit unit of the pixels PXij may be variously changed.

At least one transistor included in the pixel PXij according to an embodiment of the present disclosure may include sub-transistors connected in series. The sub-transistors connected in series may have a common gate electrode overlapping active areas of each of the sub-transistors, and the common gate electrode may overlap a common source/drain area positioned between the active areas of the sub-transistors.

When the sub-transistors include gate electrodes spaced apart from each other with a common source/drain area therebetween, that is, when the gate electrodes of the sub-transistors do not overlap the common source/drain area, the common source/drain area may be floated. In a case where the gate electrodes of the sub-transistors are provided spaced apart from each other in a plan view with a common source/drain area therebetween, when the sub-transistors are switched on-off, a kick-back phenomenon in which the voltage instantaneously increases in the common source/drain area may occur, resulting in an increase in leakage current, and as a result, flicker may occur in the display apparatus.

However, as serially connected sub-transistors according to an embodiment of the present disclosure have a common single gate electrode overlapping a common source/drain area, when the sub-transistors are switched on-off, the floating node formed in the common source/drain area may be removed to prevent or reduce the voltage from rising and the leakage current flowing to the sub-transistors may be minimized or reduced to prevent or reduce flicker from occurring in the display apparatus. Accordingly, the display quality of the display apparatus may be improved.

Figure 3:
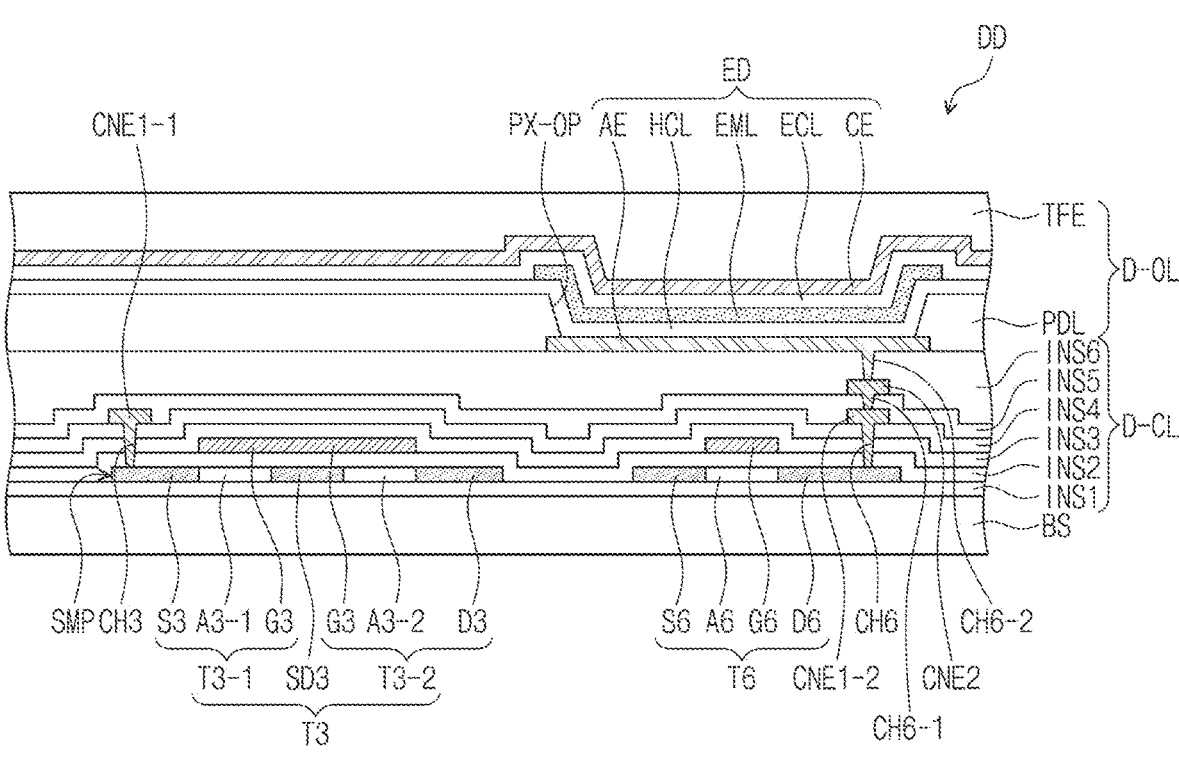
FIG. 3 is a cross-sectional view of a display apparatus according to an embodiment of the present disclosure.

FIG. 3 is a cross-sectional view of a display apparatus according to an embodiment of the present disclosure.

Referring to FIG. 3, the display apparatus DD may include a base substrate BS, a circuit element layer D-CL, and a display element layer D-OL. Each of the pixels PX of the display apparatus DD (refer to FIG. 1) may include transistors disposed in the circuit element layer D-CL, and a light emitting element ED disposed in the display element layer D-OL and connected to the transistors. As an example, FIG. 3 illustrates cross-sections of a third transistor T3, a sixth transistor T6, and a light emitting element ED among transistors constituting the pixels PX.

The base substrate BS may provide a base surface on which the circuit element layer D-CL is disposed. The base substrate BS may include a glass substrate, a metal substrate, a polymer substrate, or an organic/inorganic composite substrate.

The circuit element layer D-CL may be disposed on the base substrate BS. The circuit element layer D-CL may include a semiconductor pattern layer SMP, conductive pattern layers MP1 to MP3 (refer to FIGS. 4B to 4D), and a plurality of insulating layers INS1 to INS6 constituting the circuit unit PXC or PXC-a (refer to FIGS. 2A and 2B) of the pixel PXij (refer to FIGS. 2A and 2B).

After forming an insulating layer, a semiconductor layer, and a conductive layer on the base substrate BS through coating or deposition, a semiconductor pattern and a conductive pattern may be formed by patterning the insulating layer, the semiconductor layer, and the conductive layer through photolithography. The cross-sectional structure of the circuit element layer D-CL shown in FIG. 3 is an example and not limited thereto, and the cross-sectional structure of the circuit element layer D-CL may vary depending on a manufacturing process or configuration.

The first insulating layer INS1 may be disposed on the base substrate BS. The first insulating layer INS1 may serve as a barrier layer and/or a buffer layer including at least one inorganic layer. For example, the first insulating layer INS1 may include at least one of aluminum oxide, titanium oxide, silicon oxide, silicon nitride, silicon oxynitride, zirconium oxide, and hafnium oxide. The first insulating layer INS1 may improve a bonding force between the base substrate BS and the semiconductor pattern layer SMP and protect the semiconductor pattern layer SMP.

The second to sixth insulating layers INS2 to INS6 may be sequentially disposed on the first insulating layer INS1. Each of the second to sixth insulating layers INS2 to INS6 may include an inorganic layer or an organic layer.

The semiconductor pattern layer SMP may be disposed on the first insulating layer INS1. The semiconductor pattern layer SMP may include semiconductor patterns of transistors. FIG. 3 as an example illustrates a semiconductor pattern of the third transistor T3 and a semiconductor pattern of the sixth transistor T6.

The semiconductor pattern layer SMP may include polysilicon. However, the embodiment of the present disclosure is not limited thereto, and the semiconductor pattern layer SMP may include amorphous silicon or metal oxide.

The semiconductor pattern layer SMP may include a plurality of areas having different electrical properties depending on whether doping or not. The semiconductor pattern layer SMP may include a first area having high conductivity and a second area having low conductivity. The first area may be doped with an N-type or kind dopant or a P-type or kind dopant. The P-type or kind transistor may include a doping area doped with a P-type or kind dopant, and the N-type or kind transistor may include a doping area doped with an N-type or kind dopant. The second area may be a non-doped area. The conductivity of the first area may be greater than that of the second area, and the first area may substantially correspond to electrodes (or source and drain areas) or signal lines of the transistor. The second area may substantially correspond to an active area (or channel area) of the transistor.

Referring to FIG. 3, the semiconductor pattern of the third transistor T3 may be disposed on the same layer as the semiconductor pattern of the sixth transistor T6. The semiconductor pattern of the third transistor T3 may include a third source area S3, a third drain area D3, a plurality of third active areas A3-1 and A3-2, and a common conductive area SD3 (or common source/drain area). The semiconductor pattern of the sixth transistor T6 may include a sixth source area S6, a sixth drain area D6, and a sixth active area A6. In some embodiments, the third drain area D3 and the sixth source area S6 may be electrically connected in a plan view.

The third source area S3 and the third drain area D3 may be spaced apart from each other with a plurality of third active areas A3-1 and A3-2 therebetween, and the plurality of third active areas A3-1 and A3-2 may be spaced apart from each other with a common conductive area SD3 therebetween. For example, one of the plurality of third active areas A3-1 and A3-2 may extend from one end of the common conductive area SD3, and the other one may extend from the other end of the common conductive area SD3.

For example, the third transistor T3 may include first and second sub-transistors T3-1 and T3-2 electrically connected through the common conductive area SD3. For example, the third source area S3 may correspond to the first electrode of the first sub-transistor T3-1 described above, and the third drain area D3 may correspond to the second electrode of the second sub-transistor T3-2 described above. The plurality of third active areas A3-1 and A3-2 may constitute active areas of the first and second sub-transistors T3-1 and T3-2, respectively, and active areas of the first and second sub-transistors T3-1 and T3-2 may be connected to each other through the common conductive area SD3. As described above, the common conductive area SD3 may correspond to the second electrode of the first sub-transistor T3-1 and may correspond to the first electrode of the second sub-transistor T3-2.

Each of the third source area S3, the third drain area D3, and the common conductive area SD3 may be an area doped with a dopant. The doping concentration of each of the third source area S3, the third drain area D3, and the common conductive area SD3 may be variously changed according to the design of the third transistor T3. For example, doping concentrations of each of the third source area S3, the third drain area D3, and the common conductive area SD3 may be the same. However, the embodiment of the present disclosure is not limited thereto, and at least one of the third source area S3, the third drain area D3, and the common conductive area SD3 may have a different doping concentration from other areas. For example, the doping concentration of the common conductive area SD3 may be smaller or greater than the doping concentration of each of the third source area S3 and the third drain area D3.

The second insulating layer INS2 may be disposed on the first insulating layer INS1 to cover the semiconductor pattern layer SMP. A first conductive pattern layer MP1 (refer to FIG. 4B) may be disposed on the second insulating layer INS2. The first conductive pattern layer MP1 (refer to FIG. 4B) may include a third gate electrode G3 of the third transistor T3 and a sixth gate electrode G6 of the sixth transistor T6. For example, the third gate electrode G3 and the sixth gate electrode G6 may be disposed on the same layer.

The third gate electrode G3 is provided as an integral electrode, and may overlap the plurality of third active areas A3-1 and A3-2 and the common conductive area SD3 in a plan view. The third gate electrode G3 may not overlap each of the third source area S3 and the third drain area D3. The third gate electrode G3 may correspond to the gate electrodes of the first and second sub-transistors T3-1 and T3-2.

As a comparative example, when the common conductive area does not overlap the gate electrode, the common conductive area floats, so that when the third transistor is turned on/off, a voltage in the common conductive area may momentarily increase. However, the common conductive area SD3 of the third transistor T3 according to an embodiment of the present disclosure overlaps the third gate electrode G3 in a plan view, so that the floating node formed in the common conductive area SD3 may be removed. Through this, when the third transistor T3 is turned on/off, the instantaneous voltage increase in the common conductive area SD3 may be minimized or reduced, and flicker may be prevented or reduced from occurring in the display apparatus DD. Accordingly, the display quality of the display apparatus DD may be improved.

The sixth source area S6 and the sixth drain area D6 may be spaced apart from each other with the sixth active area A6 therebetween. The sixth gate electrode G6 may overlap the sixth active area A6 in a plan view. In an embodiment, the sixth gate electrode G6 may function as a mask in the process of doping the semiconductor pattern of the sixth transistor T6. However, the embodiment of the present disclosure is not limited thereto, and the sixth gate electrode G6 may be formed after doping the semiconductor pattern.

In some embodiments, the above-described fourth transistor T4 may include a plurality of sub-transistors connected in series, and the fourth transistor T4 may have same structure as that of the source area S3, the drain area D3, the active areas A3-1 and A3-2, the common conductive area SD3, and the gate electrode G3 of the third transistor T3. The structure of the source area, drain area, active area, and gate electrode of each of the first, second, fifth, seventh, and eighth transistors T1, T2, T5, T7, and T8 described above may be substantially the same as that of the sixth transistor T6.

The third insulating layer INS3 may be disposed on the second insulating layer INS2 to cover the gate electrodes G3 and G6. A second conductive pattern layer MP2 (refer to FIG. 4C) may be disposed on the third insulating layer INS3.

Figure 4A:
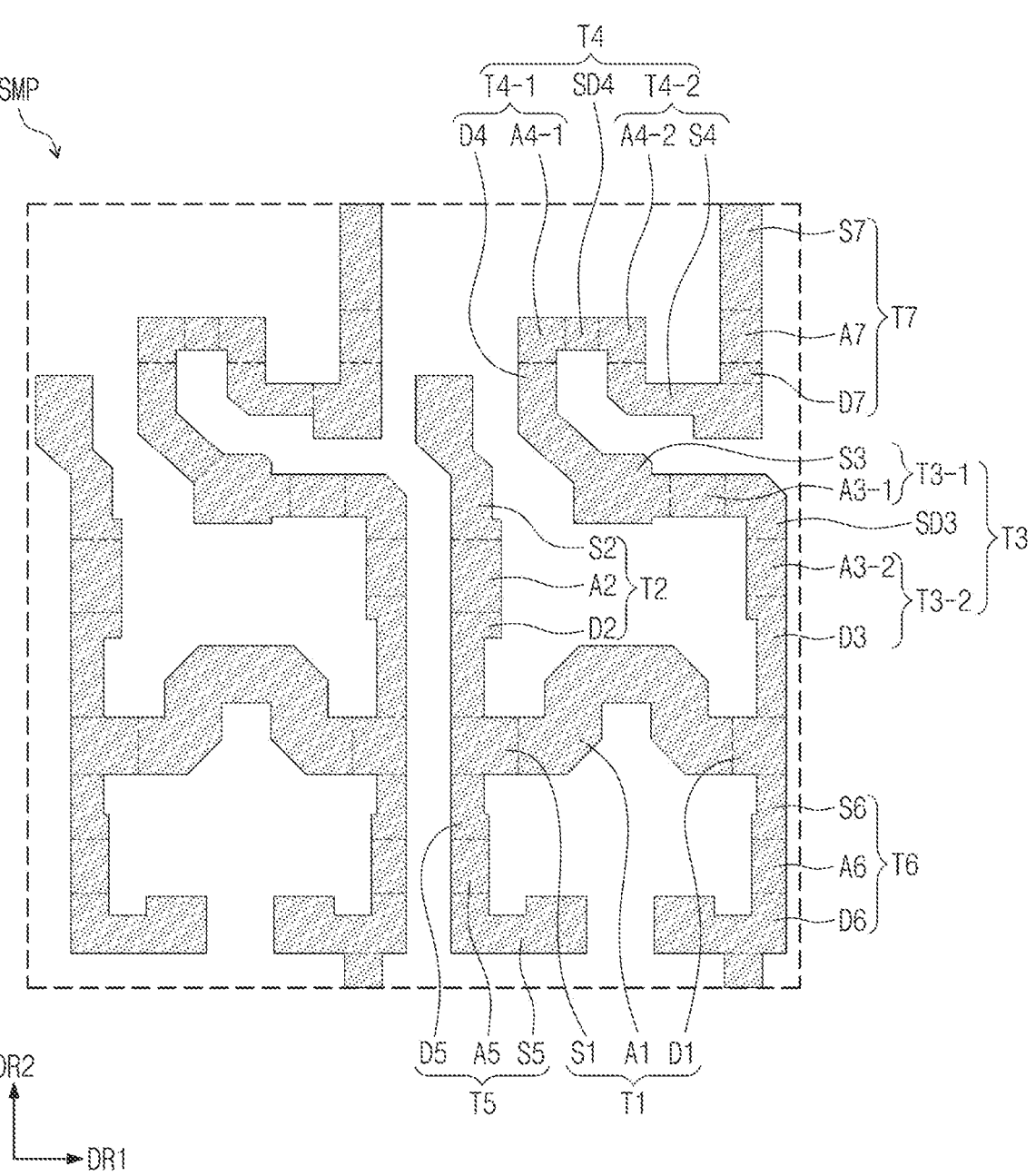
FIGS. 4A-4D are plan views illustrating a planar structure of a pixel in stages according to an embodiment of the present disclosure.
Figure 4B:
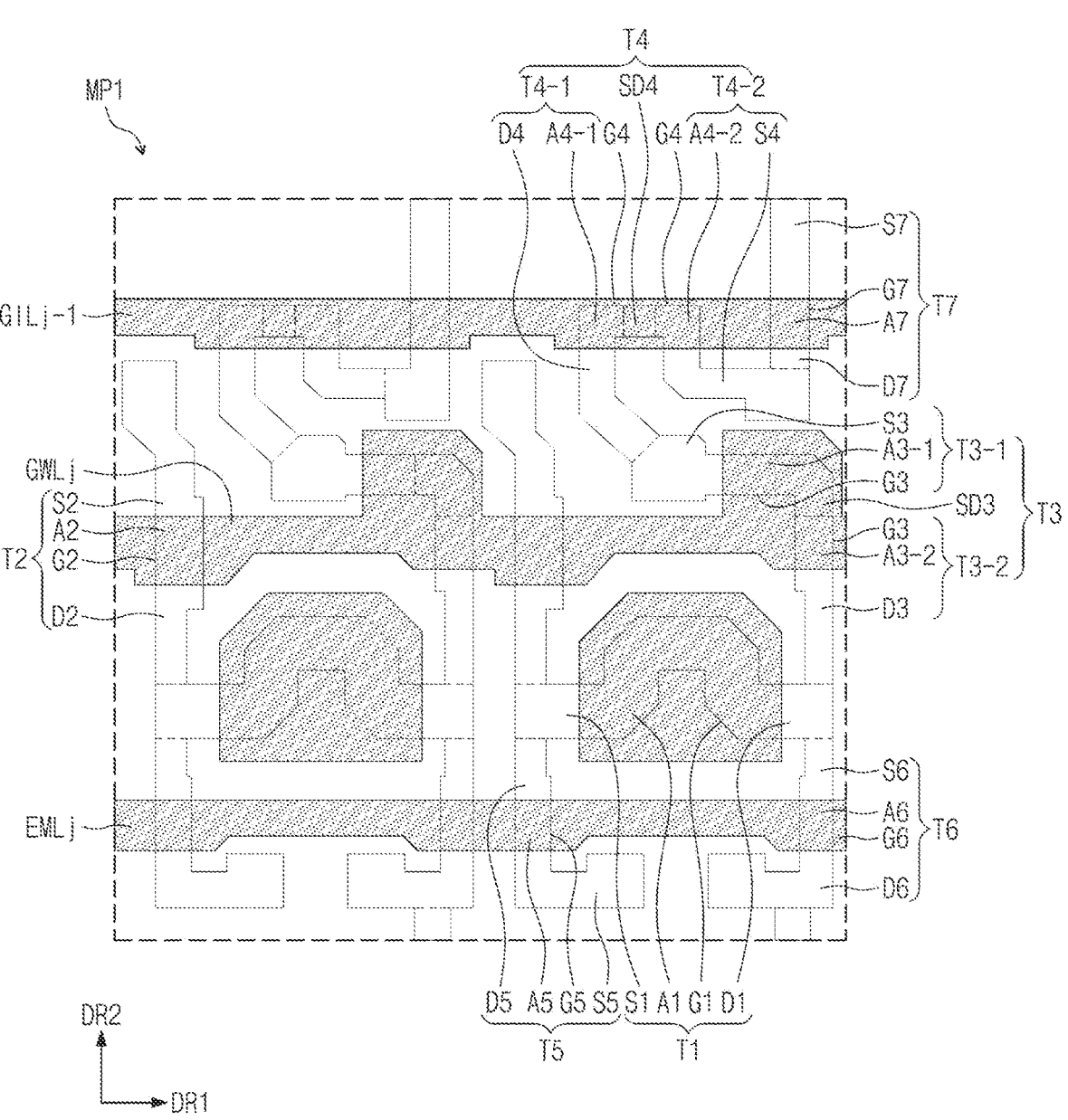
Figure 4C:
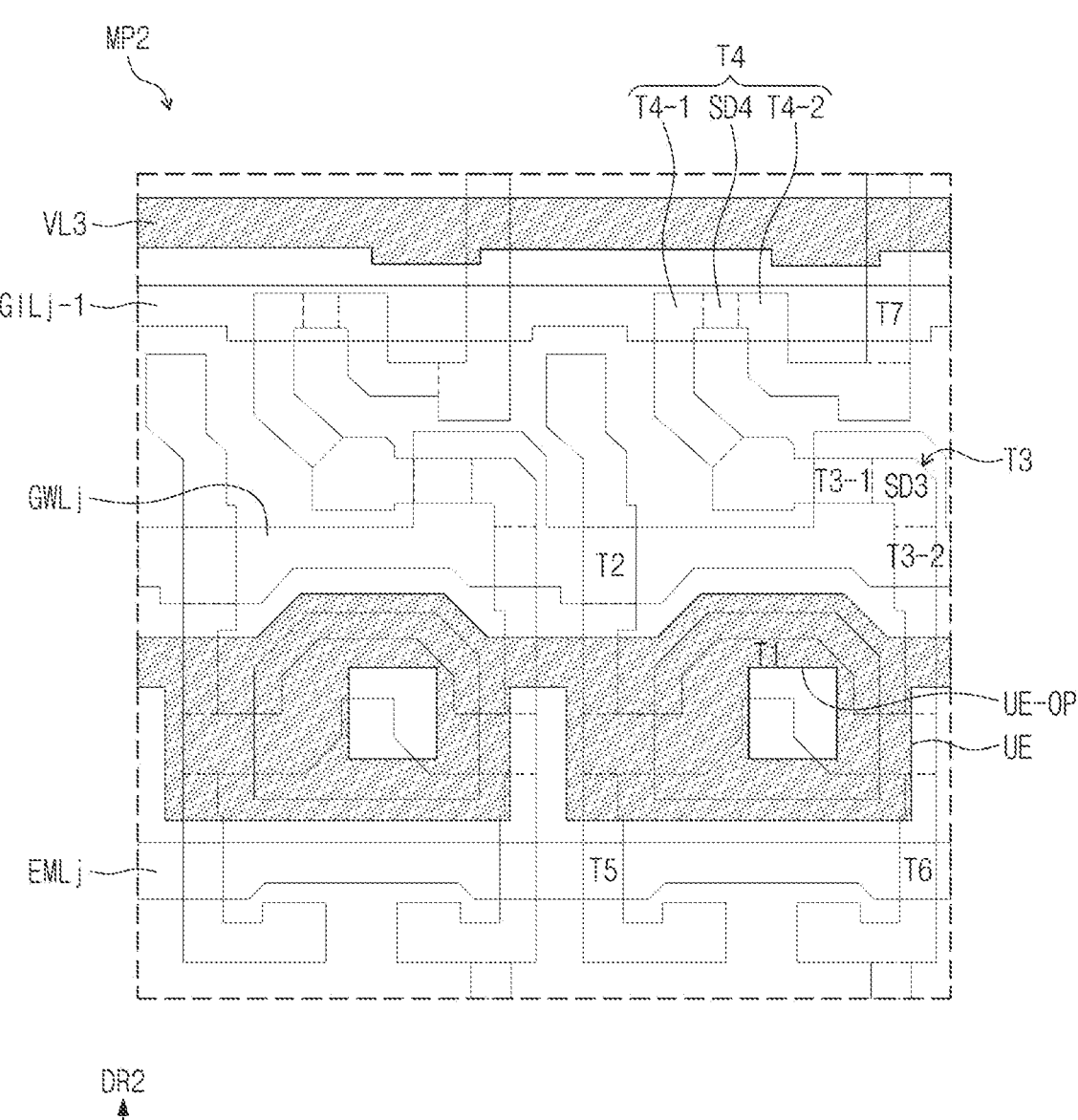

The fourth insulating layer INS4 may be disposed on the third insulating layer INS3 to cover the second conductive pattern layer MP2 (refer to FIG. 4C). A third conductive pattern layer MP3 (refer to FIG. 4D) may be disposed on the fourth insulating layer INS4. The third conductive pattern layer MP3 (refer to FIG. 4D) may include first connection electrodes CNE1-1 and CNE1-2.

The first connection electrodes CNE1-1 and CNE1-2 may include a 1-1 connection electrode CNE1-1 and a 1-2 connection electrode CNE1-2. The 1-1 connection electrode CNE1-1 may be connected to the third source area S3 of the third transistor T3 through a contact hole CH3 penetrating the second to fourth insulating layers INS2 to INS4. The 1-2 connection electrode CNE1-2 may be connected to the sixth drain area D6 of the sixth transistor T6 through a contact hole CH6 penetrating the second to fourth insulating layers INS2 to INS4.

Figure 4D:
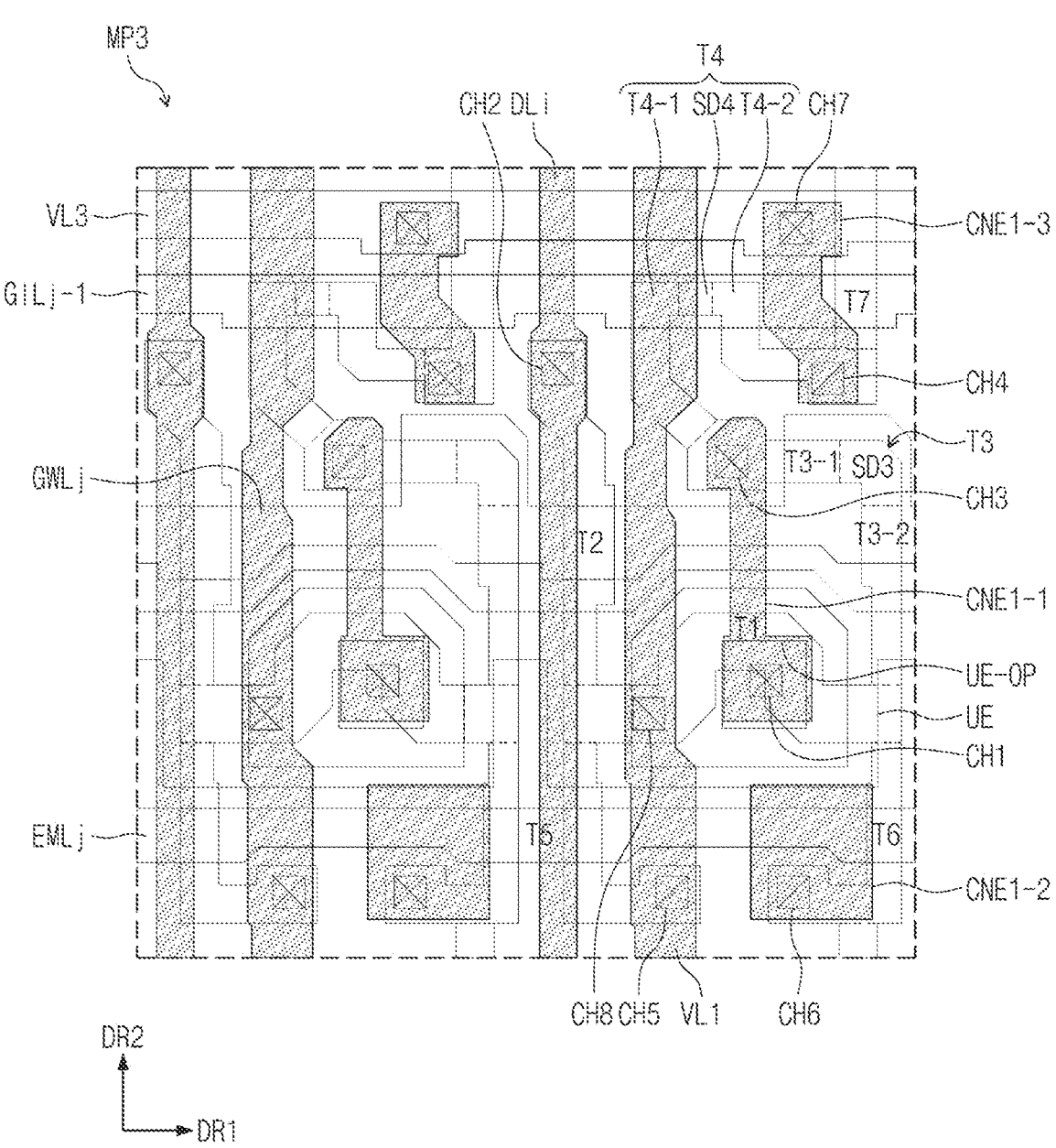

The fifth insulating layer INS5 may be disposed on the fourth insulating layer INS4 to cover the third conductive pattern layer MP3 (refer to FIG. 4D). For example, the fifth insulating layer INS5 may cover the first connection electrodes CNE1-1 and CNE1-2. A fourth conductive pattern layer may be disposed on the fifth insulating layer INS5. The fourth conductive pattern layer may include a second connection electrode CNE2. The second connection electrode CNE2 may be connected to the 1-2 connection electrode CNE1-2 through a contact hole CH6-1 penetrating the fifth insulating layer INS5.

The sixth insulating layer INS6 may be disposed on the fifth insulating layer INS5 to cover the second connection electrode CNE2. In one embodiment, the sixth insulating layer INS6 may include at least one organic layer, and the sixth insulating layer INS6 may cover curved upper surfaces of components disposed under the sixth insulating layer INS6 and provide a flat upper surface.

The display element layer D-OL may be disposed on the circuit element layer D-CL. The display element layer D-OL may include the light emitting element ED, a pixel defining layer PDL, and an encapsulation layer TFE. The light emitting element ED may include a first electrode AE, a second electrode CE, a hole control layer HCL, an electron control layer ECL, and a light emitting layer EML. In an embodiment, the first electrode AE of the light emitting element ED may correspond to the anode AE, and the second electrode CE may correspond to the cathode CE.

The first electrode AE of the light emitting element ED and the pixel defining film PDL may be disposed on the sixth insulating layer INS6. The first electrode AE may be connected to the second connection electrode CNE2 through a contact hole CH6-2 penetrating the sixth insulating layer INS6. For example, the first electrode AE of the light emitting element ED may be electrically connected to the sixth drain area D6 of the sixth transistor T6 through the connection electrodes CNE1-2 and CNE2.

An emission opening PX-OP exposing at least a portion of the first electrode AE may be defined in the pixel defining film PDL. In the present embodiment, the portion of the first electrode AE exposed by the emission opening PX-OP may correspond to an emission area.

The pixel defining film PDL may include a polymer resin, and may further include an inorganic material contained in the polymer resin. The pixel defining film PDL according to an embodiment may have a color. For example, the pixel defining film PDL may include a base resin and a black pigment and/or black dye mixed in the base resin. However, the embodiment of the pixel defining film PDL is not limited thereto.

The hole control layer HCL may be disposed on the first electrode AE and the pixel defining film PDL. The hole control layer HCL may be commonly disposed on the pixels PX (refer to FIG. 1). The hole control layer HCL may include at least one of a hole injection layer, a hole transport layer, and an electron blocking layer.

The light emitting layer EML may be disposed on the hole control layer HCL. The light emitting layer EML may be disposed in an area corresponding to the emission opening PX-OP. The light emitting layer EML may include an organic material and/or an inorganic material. The light emitting layer EML may generate any one of red, green, and blue light.

The electron control layer ECL may be disposed on a light emitting layer EML and the hole control layer HCL. The electron control layer ECL may be commonly disposed on the pixels PX (refer to FIG. 1). The electron control layer ECL may include at least one of an electron injection layer, an electron transport layer, and a hole blocking layer.

The second electrode CE may be disposed on the electron control layer ECL. The second electrode CE may be commonly disposed on the pixels PX (refer to FIG. 1).

The first driving voltage ELVDD (refer to FIG. 2A) may be applied to the first electrode AE, and the second driving voltage ELVSS (refer to FIG. 2A) may be applied to the second electrode CE. The holes and electrons injected into the light emitting layer EML are combined to form excitons, and as the excitons transition to the ground state, the light emitting element ED may be configured to emit light.

The encapsulation layer TFE may be disposed on the light emitting element ED to seal the light emitting element ED. The encapsulation layer TFE may include a plurality of thin films. For example, the encapsulation layer TFE may include inorganic films and an organic film disposed between the inorganic films. Thin films of the encapsulation layer TFE may be disposed to improve optical efficiency of the light emitting element ED or to protect the light emitting element ED. The inorganic film may protect the light emitting element ED from moisture and/or oxygen, and the organic film may protect the light emitting element ED from foreign substances such as dust particles.

FIGS. 4A to 4D are plan views illustrating the planar structure of the pixel illustrated in FIG. 2A in stages. FIGS. 4A to 4D illustrate a sequential stacking structure of some patterns constituting the pixel PXij (refer to FIG. 2A).

Referring to FIG. 4A, a semiconductor pattern layer SMP may be disposed on the base substrate BS (refer to FIG. 3). The semiconductor pattern layer SMP may include semiconductor patterns of the first to seventh transistors T1 to T7 including a plurality of areas having different doping concentrations. For example, first to seventh source areas S1 to S7, first to seventh drain areas D1 to D7, and first to seventh active areas A1 to A7 of the first to seventh transistors T1 to T7 may be formed from the semiconductor pattern layer SMP. For example, the semiconductor patterns of the first to seventh transistors T1 to T7 may be disposed on the same layer.

The first source area S1 and the first drain area D1 of the first transistor T1 may be spaced apart from each other with the first active area A1 therebetween. The first drain area D1 of the first transistor T1 may be connected to the third drain area D3 of the third transistor T3 and the sixth source area S6 of the sixth transistor T6. The first source area S1 of the first transistor T1 may be connected to the second drain area D2 of the second transistor T2 and the fifth drain area D5 of the fifth transistor T5.

The second source area S2 and the second drain area D2 of the second transistor T2 may be spaced apart from each other with the second active area A2 therebetween, and the fifth source area S5 and the fifth drain area D5 of the fifth transistor T5 may be spaced apart from each other with the fifth active area A5 therebetween.

The sixth source area S6 and the sixth drain area D6 of the sixth transistor T6 may be spaced apart from each other with the sixth active area A6 therebetween. The sixth drain area D6 of the sixth transistor T6 may be connected to the seventh source area S7 of the seventh transistor T7.

The seventh source area S7 and the seventh drain area D7 of the seventh transistor T7 may be spaced apart from each other with the seventh active area A7 therebetween. The seventh drain area D7 of the seventh transistor T7 may be connected to the fourth source area S4 of the fourth transistor T4.

In an embodiment, the third and fourth transistors T3 and T4 may include a plurality of sub-transistors T3-1, T3-2, T4-1, and T4-2, respectively. The third transistor T3 may include a plurality of third active areas A3-1 and A3-2 spaced apart from each other. The plurality of third active areas A3-1 and A3-2 may be spaced apart from each other with a common conductive area SD3 of the third transistor T3 therebetween. The fourth transistor T4 may include a plurality of fourth active areas A4-1 and A4-2 spaced apart from each other. The plurality of fourth active areas A4-1 and A4-2 may be spaced apart from each other with a common conductive area SD4 of the fourth transistor T4 therebetween.

The third source area S3 and the third drain area D3 of the third transistor T3 may be spaced apart from each other with the plurality of third active areas A3-1 and A3-2 and the common conductive area SD3 therebetween. The fourth source area S4 and the fourth drain area D4 of the fourth transistor T4 may be spaced apart from each other with the plurality of fourth active areas A4-1 and A4-2 and the common conductive area SD4 therebetween. The fourth drain area D4 of the fourth transistor T4 may be connected to the third source area S3 of the third transistor T3.

FIG. 4A as an example illustrates an embodiment in which the third and fourth transistors T3 and T4 include sub-transistors T3-1, T3-2, T4-1, and T4-2 connected in series, but, the embodiment of the present disclosure is not limited thereto, and one of the third and fourth transistors T3 and T4 may include a plurality of sub-transistors.

Referring to FIG. 4B, a first conductive pattern layer MP1 may be disposed on the semiconductor pattern layer SMP. An insulating layer (e.g., the second insulating layer INS2 of FIG. 3) may be disposed between the semiconductor pattern layer SMP and the first conductive pattern layer MP1. The first conductive pattern layer MP1 may include the first to seventh gate electrodes G1 to G7 of the first to seventh transistors T1 to T7, first and second scan lines GILj–1 and GWLj, and an emission control line EMLj.

The first gate electrode G1 is disposed on the semiconductor pattern of the first transistor T1, and may overlap the first active area A1 in a plan view.

The first scan line GILj–1 may extend in the first direction DR1 to overlap the semiconductor patterns of the fourth transistor T4 and the seventh transistor T7 in a plan view. A portion of the first scan line GILj–1 may overlap the plurality of fourth active areas A4-1 and A4-2 and the common conductive area SD4, and may be formed as the fourth gate electrode G4 of the fourth transistor T4. Another portion of the first scan line GILj–1 may overlap the seventh active area A7 and may be formed as the seventh gate electrode G7 of the seventh transistor T7. In some embodiments, the seventh transistor T7 illustrated in FIG. 4B may be the seventh transistor T7 of the previous stage pixel.

The second scan line GWLj may extend in the first direction DR1 to overlap the semiconductor patterns of the second transistor T2 and the third transistor T3 in a plan view. A portion of the second scan line GWLj may overlap the second active area A2 and may be formed as the second gate electrode G2 of the second transistor T2. Another portion of the second scan line GWLj may overlap the plurality of third active areas A3-1 and A3-2 and the common conductive area SD3, and may be formed as the third gate electrode G3 of the third transistor T3.

As the third and fourth gate electrodes G3 and G4 of the third transistor T3 and the fourth transistor T4 overlap the common conductive areas SD3 and SD4, respectively, it is possible to prevent or reduce a floating node from being formed in the common conductive areas SD3 and SD4 and to prevent or reduce an instantaneous voltage rise in the common conductive areas SD3 and SD4 by the floating node. Accordingly, the leakage current flowing through the third transistor T3 and the fourth transistor T4 may be minimized or reduced, and display quality of the display apparatus may be improved.

The emission control line EMLj may extend in the first direction DR1 to overlap the semiconductor patterns of the fifth transistor T5 and the sixth transistor T6 in a plan view. A portion of the emission control line EMLj may overlap the fifth active area A5 and may be formed as the fifth gate electrode G5 of the fifth transistor T5. Another portion of the emission control line EMLj may overlap the sixth active area A6 and may be formed as the sixth gate electrode G6 of the sixth transistor T6.

Referring to FIG. 4C, a second conductive pattern layer MP2 may be disposed on the first conductive pattern layer MP1. An insulating layer (e.g., the third insulating layer INS3 of FIG. 3) may be disposed between the first conductive pattern layer MP1 and the second conductive pattern layer MP2. The second conductive pattern layer MP2 may include an upper electrode UE and a third voltage line VL3.

The third voltage line VL3 may extend in the first direction DR1. A first initialization voltage VINT (refer to FIG. 2A) may be transmitted to the third voltage line VL3.

An opening part UE-OP may be defined in the upper electrode UE. The upper electrode UE may partially overlap the first gate electrode G1. Portions of the upper electrode UE and the first gate electrode G1 overlapping each other may form a capacitor Cst (refer to FIG. 2A). For example, the first electrode of the capacitor Cst (refer to FIG. 2A) may correspond to the upper electrode UE overlapping the first gate electrode G1, and the second electrode of the capacitor Cst (refer to FIG. 2A) may correspond to a portion of the first gate electrode G1 overlapping the upper electrode UE.

Referring to FIG. 4D, a third conductive pattern layer MP3 may be disposed on the second conductive pattern layer MP2. An insulating layer (e.g., the fourth insulating layer INS4 of FIG. 3) may be disposed between the second conductive pattern layer MP2 and the third conductive pattern layer MP3. The third conductive pattern layer MP3 may include a data line DLi, a first voltage line VL1, and first connection electrodes CNE1-1, CNE1-2, and CNE1-3.

Each of the data line DLi and the first voltage line VL1 may extend in the second direction DR2. The data line DLi and the first voltage line VL1 may cross the scan lines GILj–1 and GWLj, the emission control line EMLj, and the third voltage line VL3 in a plan view.

The data line DLi may be connected to the second source area S2 of the second transistor T2 through a contact hole CH2. A first driving voltage ELVDD (refer to FIG. 2A) may be transmitted to the first voltage line VL1. The first voltage line VL1 may be connected to the fifth source area S5 of the fifth transistor T5 and the upper electrode UE corresponding to the first electrode of the capacitor Cst (refer to FIG. 2A) through contact holes CH5 and CH8, respectively.

The first connection electrodes CNE1-1, CNE1-2, and CNE1-3 may include a 1-1 connection electrode CNE1-1, a 1-2 connection electrode CNE1-2, and a 1-3 connection electrode CNE1-3. The 1-1 connection electrode CNE1-1 may be connected to the first gate electrode G1 of the first transistor T1 and the third source area S3 of the third transistor T3 through contact holes CH1 and CH3, respectively. For example, the first gate electrode G1 and the third source area S3 may be electrically connected through the 1-1 connection electrode CNE1-1. The 1-2 connection electrodes CNE1-2 may be connected to the sixth drain area D6 of the sixth transistor T6 through a contact hole CH6. As described above, the 1-2 connection electrode CNE1-2 may be a portion electrically connected to the first electrode AE (refer to FIG. 3) of the light emitting element ED (refer to FIG. 3). The 1-3 connection electrode CNE1-3 may be respectively connected to the fourth source area S4 of the fourth transistor T4 and the third voltage line VL3 through contact holes CH4 and CH7. For example, the fourth source area S4 and the third voltage line VL3 may be electrically connected through the 1-3 connection electrode CNE1-3.

In some embodiments, the shapes of the patterns constituting the pixels PXij (refer to FIG. 2A) illustrated in FIGS. 4A to 4D are examples and not necessarily limited thereto.

FIGS. 5A to 5F are cross-sectional views illustrating an operation of a method of manufacturing a display apparatus according to an embodiment of the present disclosure. The operations illustrated in FIGS. 5A to 5F may correspond to operations of manufacturing some components of the display apparatus DD illustrated in FIG. 3.

Figure 5A:
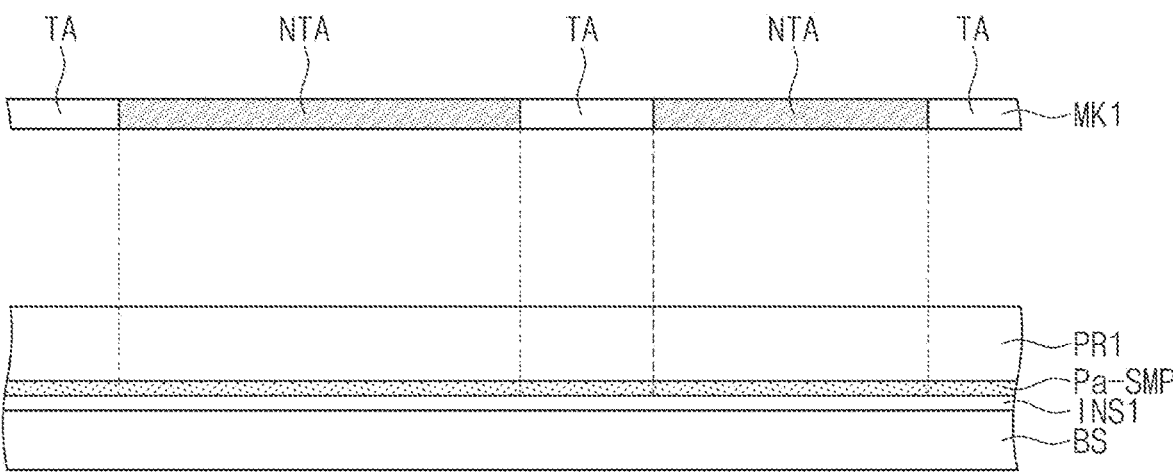
FIGS. 5A-5F are cross-sectional views illustrating an operation of a method of manufacturing a display apparatus according to an embodiment of the present disclosure.

Referring to FIG. 5A, in order to form a semiconductor pattern layer SMP (refer to FIG. 5E), a preliminary semiconductor layer Pa-SMP may be deposited on the first insulating layer INS1 disposed on the base substrate BS. In an embodiment, the preliminary semiconductor layer Pa-SMP may include a silicon semiconductor material. After the preliminary semiconductor layer Pa-SMP is formed, a first photoresist layer PR1 may be coated on the preliminary semiconductor layer Pa-SMP.

In order to pattern the preliminary semiconductor layer Pa-SMP, a first mask MK1 including a transmissive area TA and a non-transmissive area NTA may be provided on the first photoresist layer PR1. Thereafter, an exposure process for providing light on the first mask MK1 may be performed. The non-transmissive area NTA of the first mask MK1 may block or reduce light, and the transmissive area TA may be configured to transmit light. Light may be irradiated to a portion of the first photoresist layer PR1 corresponding to the transmissive area TA. Although the first mask MK1 having a non-transmissive area NTA is provided as an example in the process operation, a mask having a half-transmissive area may be provided.

Figure 5B:
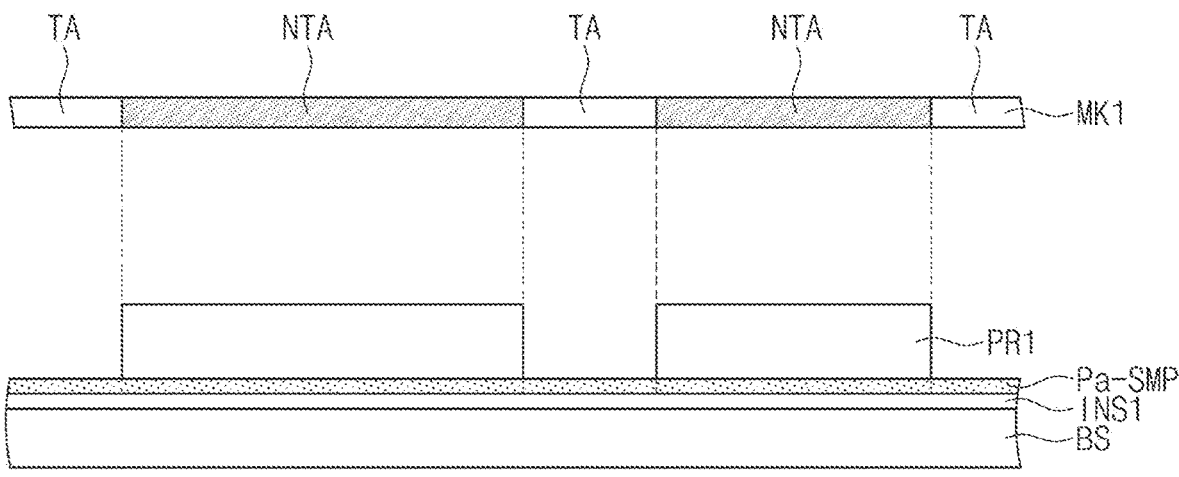

Referring to FIG. 5B, after the exposure process, a developing process of providing a developer on the first photoresist layer PR1 irradiated with light may be performed. By the developer, a portion of the first photoresist layer PR1 overlapping the non-transmissive area NTA may remain, and another portion of the first photoresist layer PR1 overlapping the transmissive area TA may be removed. A portion of the preliminary semiconductor layer Pa-SMP may be exposed by the first photoresist layer PR1 partially removed to correspond to the transmissive area TA of the first mask MK1. In the present embodiment, the patterned first photoresist layer PR1 may be defined as a first photoresist pattern.

Figure 5C:
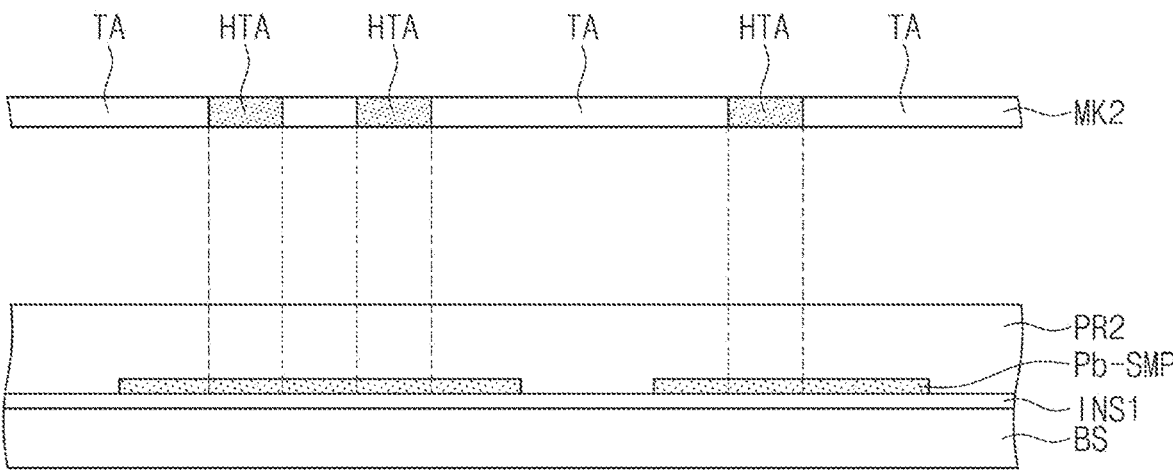

Referring to FIG. 5C, a portion of the preliminary semiconductor layer Pa-SMP exposed by the first photoresist layer PR1 (the first photoresist pattern) may be removed through an etching process. The preliminary semiconductor layer Pa-SMP patterned through the above process may correspond to the preliminary semiconductor pattern layer Pb-SMP. The preliminary semiconductor pattern layer Pb- SMP may have a pattern corresponding to the non-transmissive area NTA (refer to FIG. 5B) of the first mask MK1 (refer to FIG. 5B).

On the other hand, although it has been described based on a positive photo process in which a pattern is formed corresponding to the non-transmissive area of the mask, the embodiment of the present disclosure is not limited thereto, and a preliminary semiconductor pattern layer Pb-SMP may be formed through a negative photo process in which a pattern is formed corresponding to the transmissive area of the mask.

Referring to FIG. 5C, in order to form the semiconductor pattern layer SMP (refer to FIG. 5E) by doping the preliminary semiconductor pattern layer Pb-SMP, a second photoresist layer PR2 may be deposited on the preliminary semiconductor pattern layer Pb-SMP. Thereafter, a second mask MK2 including a transmissive area TA and a half-transmissive area HTA may be provided on the second photoresist layer PR2. Thereafter, an exposure process for providing light on the second mask MK2 may be performed. In this case, the amount of light passing through the half-transmissive area HTA may be smaller than the amount of light passing through the transmissive area TA. Accordingly, the amount of light irradiated to a portion of the second photoresist layer PR2 overlapping the half-transmissive area HTA may be smaller than the amount of light irradiated to another portion of the second photoresist layer PR2 overlapping the transmissive area TA.

Figure 5D:
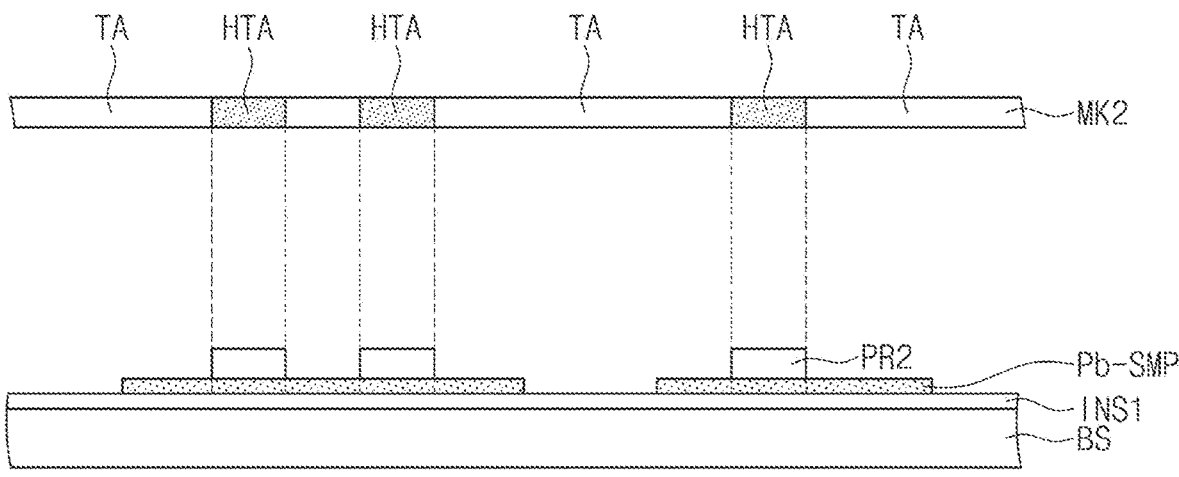

Referring to FIG. 5D, after the developing process, the portion of the second photoresist layer PR2 overlapping the half-transmissive area HTA may remain, and another portion of the second photoresist layer PR2 overlapping the transmissive area TA may be removed. A portion of the preliminary semiconductor pattern layer Pb-SMP may be exposed by the second photoresist layer PR2 from which a portion is removed corresponding to the transmissive area TA. In this embodiment, the patterned second photoresist layer PR2 may be defined as a second photoresist pattern.

A dopant is provided on the preliminary semiconductor pattern layer Pb-SMP partially exposed by the second photoresist layer PR2 (the second photoresist pattern) so that a portion of the preliminary semiconductor pattern layer Pb-SMP may be doped. For example, the portion of the preliminary semiconductor pattern layer Pb-SMP exposed by the second photoresist layer PR2 (the second photoresist pattern) may be doped, and another portion of the preliminary semiconductor pattern layer Pb-SMP overlapping the second photoresist layer PR2 may not be doped.

Figure 5E:
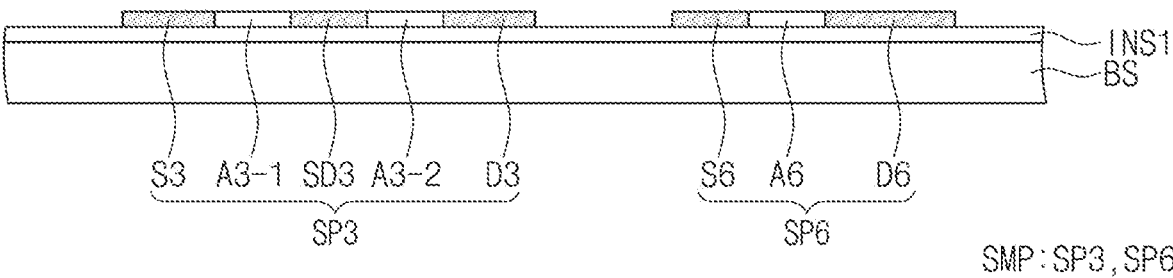

FIG. 5E illustrates the semiconductor pattern layer SMP formed by doping the preliminary semiconductor pattern layer Pb-SMP. Referring to FIG. 5E, a portion of the semiconductor pattern layer SMP overlapping the patterned second photoresist layer PR2 (refer to FIG. 5D) is not doped, so that active areas A3-1, A3-2, and A6 may be formed. A portion of the semiconductor pattern layer SMP exposed from the patterned second photoresist layer PR2 (refer to FIG. 5D) is doped, so that the portion may be formed as conductive source areas S3 and S6 and drain areas D3 and D6.

For example, by doping the preliminary semiconductor pattern layer Pb-SMP (refer to FIG. 5D), the semiconductor patterns SP3 and SP6 including a plurality of areas having different conductivity may be formed. Hereinafter, the semiconductor patterns SP3 and SP6 illustrated in FIG. 5E will be referred to as a third semiconductor pattern SP3 and a sixth semiconductor pattern SP6.

The third semiconductor pattern SP3 may include a plurality of active areas A3-1 and A3-2 spaced apart from each other with a common conductive area SD3 therebetween, and a third source area S3 and a third drain area D3 spaced apart with the plurality of active areas A3-1 and A3-2 therebetween. The sixth semiconductor pattern SP6 may include a sixth source area S6 and a sixth drain area D6 spaced apart with one sixth active area A6 therebetween.

According to an embodiment, the patterned second photoresist layer PR2 (refer to FIG. 5D) may be formed utilizing the second mask MK2 including the half-transmissive area HTA, and by proceeding with the doping process utilizing this, the third semiconductor pattern SP3 including the common conductive area SD3 located between the plurality of active areas A3-1 and A3-2, and the third source area S3 and the third drain area D3 spaced apart with the plurality of active areas A3-1 and A3-2 therebetween may be formed. The sixth semiconductor pattern SP6 having the sixth source area S6 and the sixth drain area D6 spaced apart with the one sixth active area A6 therebetween may also be formed in substantially the same doping process. For example, the third semiconductor pattern SP3 including the plurality of active areas A3-1 and A3-2 and the sixth semiconductor pattern SP6 including the single active area A6 may be concurrently (e.g., simultaneously) formed in substantially the same doping process operation. However, the embodiment of the present disclosure is not limited thereto, and the sixth semiconductor pattern SP6 may be formed through a doping process utilizing the gate electrode as a mask.

Figure 5F:
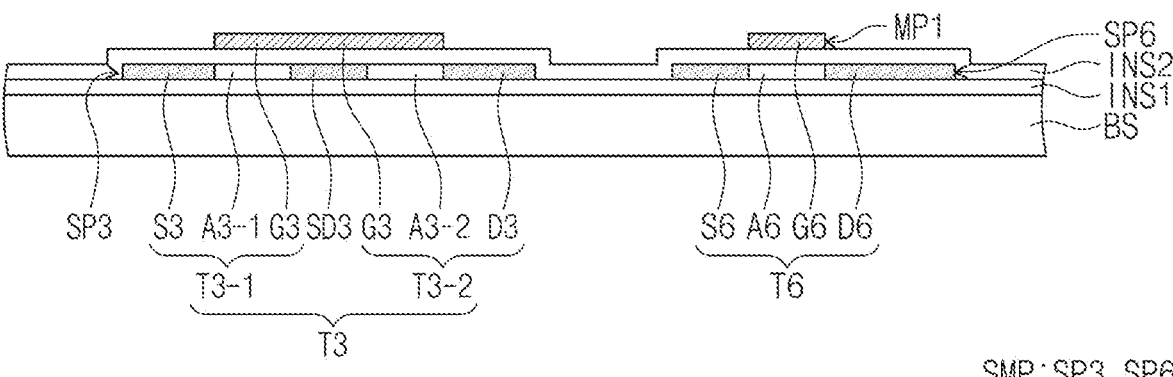

Referring to FIG. 5F, a second insulating layer INS2 may be deposited on the semiconductor pattern layer SMP. Thereafter, a first conductive pattern layer MP1 may be formed by depositing and patterning a preliminary conductive layer on the second insulating layer INS2. A third gate electrode G3 overlapping the third semiconductor pattern SP3 and a sixth gate electrode G6 overlapping the sixth semiconductor pattern SP6 may be formed from the first conductive pattern layer MP1.

The third gate electrode G3 may overlap the plurality of active areas A3-1 and A3-2 and the common conductive area SD3 of the third semiconductor pattern SP3 in a plan view. The sixth gate electrode G6 may overlap the active area A6 of the sixth semiconductor pattern SP6.

The third semiconductor pattern SP3 and the third gate electrode G3 may constitute the third transistor T3, and the sixth semiconductor pattern SP6 and the sixth gate electrode G6 may constitute the sixth transistor T6. FIGS. 5C to 5F show exemplarily that the source area S6 and the drain area D6 of the sixth semiconductor pattern SP6 are formed through the same doping process as the common conductive area SD3, the source area S3, and the drain area D3 of the third semiconductor pattern SP3. However, embodiments of the present disclosure are not limited thereto, and a doping process for forming the sixth semiconductor pattern SP6 may be differentiated from a doping process for forming the common conductive area SD3. This will be described with reference to FIGS. 6A to 6E.

FIGS. 6A to 6E are cross-sectional views illustrating an operation of a method of manufacturing a display apparatus according to an embodiment of the present disclosure.

Figure 6A:
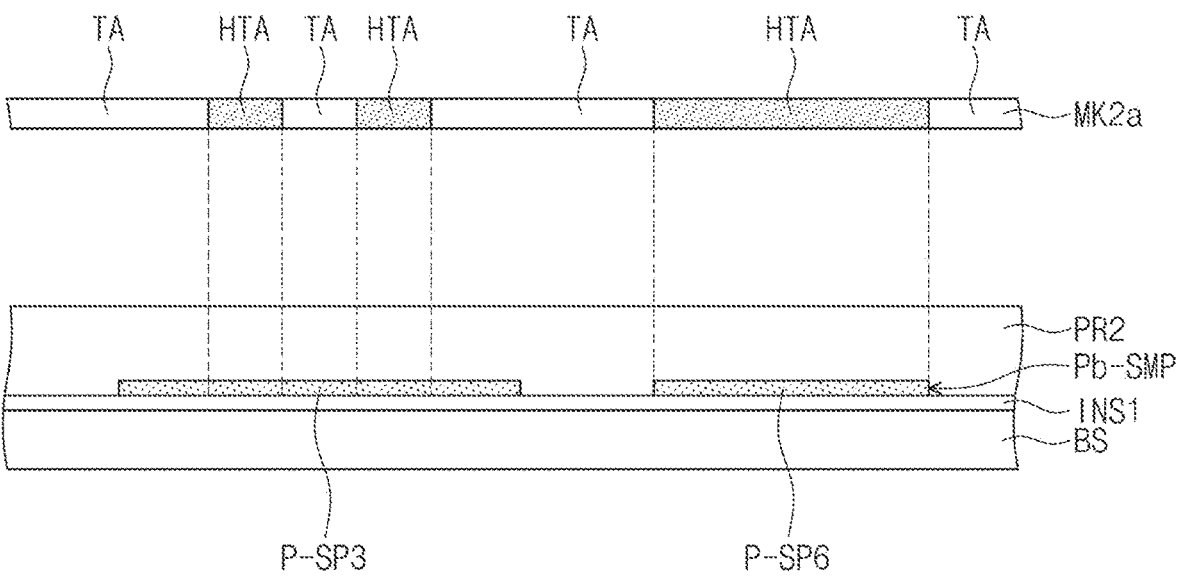
FIGS. 6A-6E are cross-sectional views illustrating an operation of a method of manufacturing a display apparatus according to an embodiment of the present disclosure.

Referring to FIG. 6A, a preliminary semiconductor pattern layer Pb-SMP may be formed through the process described above with reference to FIGS. 5A and 5B. The preliminary semiconductor pattern layer Pb-SMP may include a third preliminary semiconductor pattern P-SP3 and a preliminary sixth semiconductor pattern P-SP6. The preliminary third semiconductor pattern P-SP3 and the preliminary sixth semiconductor pattern P-SP6 may be formed as a third semiconductor pattern SP3 (refer to FIG. 6E) and a sixth semiconductor pattern SP6 (refer to FIG. 6E) through each subsequent process.

After applying the second photoresist layer PR2 on the preliminary semiconductor pattern layer Pb-SMP, a second mask MK2a including a transmissive area TA and a half-transmissive area HTA may be provided on the second photoresist layer PR2. The half-transmissive area HTA of the second mask MK2a according to an embodiment may overlap some portions of the third preliminary semiconductor pattern P-SP3 and the entire area of the sixth preliminary semiconductor pattern P-SP6.

Figure 6B:
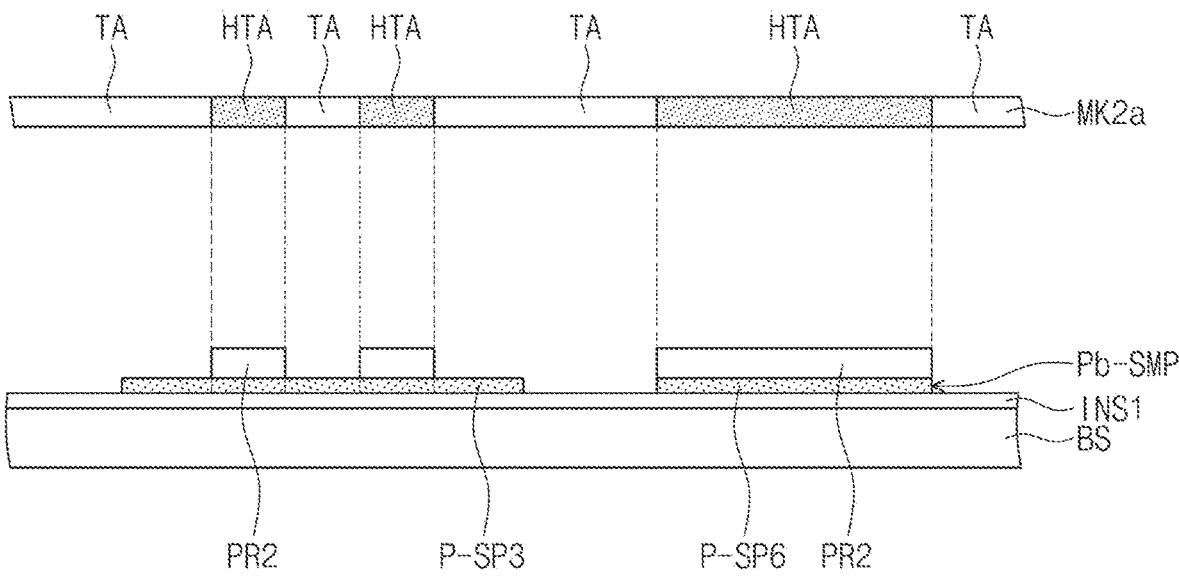

Referring to FIG. 6B, after the exposure process and the developing process are performed, the second photoresist layer PR2 may be patterned to correspond to the half-transmissive area HTA of the second mask MK2a. A portion of the preliminary third semiconductor pattern P-SP3 may be exposed by the second photoresist layer PR2 partially removed to correspond to the transmissive area TA. A portion of the third preliminary semiconductor pattern P-SP3 exposed from the patterned second photoresist layer PR2 may be doped by providing a dopant on the third preliminary semiconductor pattern P-SP3. In this case, the other portion of the third preliminary semiconductor pattern P-SP3 overlapping the patterned second photoresist layer PR2 may not be doped.

In some embodiments, the preliminary sixth semiconductor pattern P-SP6 may be covered by the patterned second photoresist layer PR2. Accordingly, while a portion of the preliminary third semiconductor pattern P-SP3 is doped, the preliminary sixth semiconductor pattern P-SP6 may not be doped.

Figure 6C:
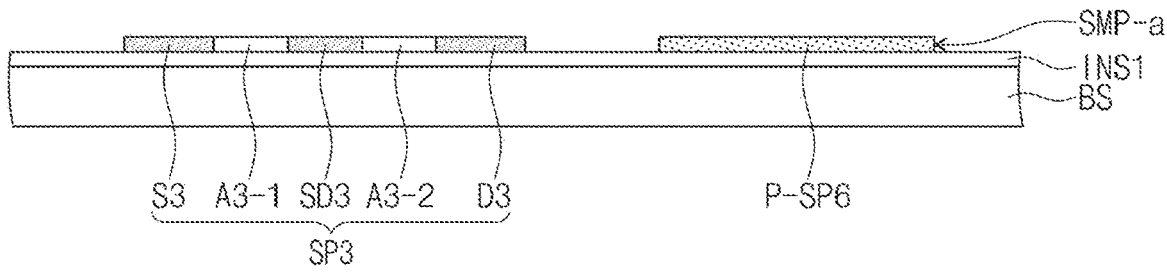

Referring to FIG. 6C, the preliminary semiconductor pattern layer SMP-a may include a third semiconductor pattern SP3 and a preliminary sixth semiconductor pattern P-SP6. The preliminary third semiconductor pattern P-SP3 (refer to FIG. 6B) may be formed as the third semiconductor pattern SP3 through a doping process. The third semiconductor pattern SP3 may include a third source area S3, a third drain area D3, and a common conductive area SD3 doped with a dopant, and a plurality of active areas A3-1 and A3-2 that are not doped with a dopant. Through the second photoresist layer PR2 patterned utilizing the second mask MK2a, the plurality of active areas A3-1 and A3-2 spaced apart with the common conductive area SD3 therebetween may be formed. In the process of forming the common conductive area SD3 of the third semiconductor pattern SP3, the preliminary sixth semiconductor pattern P-SP6 may not be doped.

Figure 6D:
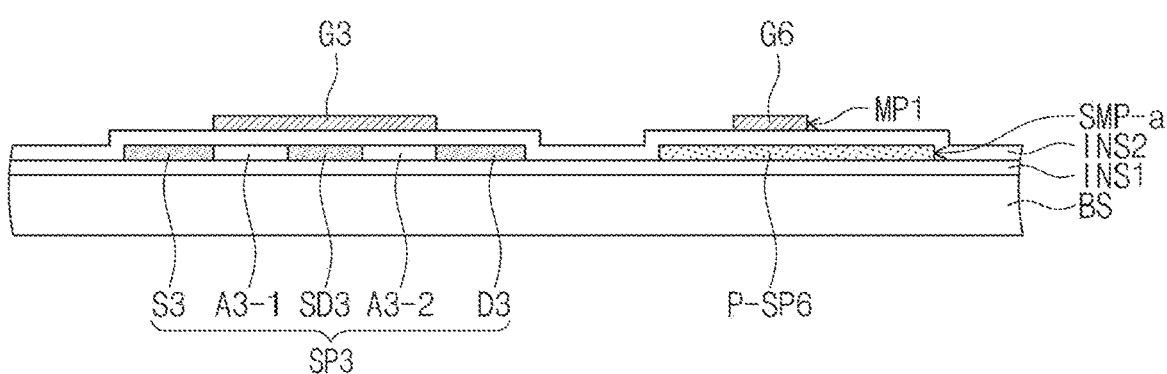

Referring to FIG. 6D, a second insulating layer INS2 may be deposited on the third semiconductor pattern SP3 and the preliminary sixth semiconductor pattern P-SP6. Thereafter, a first conductive pattern layer MP1 may be formed by depositing and patterning a preliminary conductive layer on the second insulating layer INS2. The first conductive pattern layer MP1 may include a third gate electrode G3 overlapping the third semiconductor pattern SP3 and a sixth gate electrode G6 overlapping the preliminary sixth semiconductor pattern P-SP6.

The third gate electrode G3 may overlap the plurality of active areas A3-1 and A3-2 and the common conductive area SD3 of the third semiconductor pattern SP3. The third gate electrode G3 may not overlap the third source area S3 and the third drain area D3 of the third semiconductor pattern SP3. The sixth gate electrode G6 may be disposed to correspond to an area in which a sixth active area A6 (refer to FIG. 6E) of the preliminary sixth semiconductor pattern P-SP6 is to be formed.

After forming the first conductive pattern layer MP1, a dopant is provided on the preliminary semiconductor pattern layer SMP-a, such that a portion of the preliminary sixth semiconductor pattern P-SP6 exposed from the first conductive pattern layer MP1 may be doped. In this case, the third source area S3 and the third drain area D3 of the third semiconductor pattern SP3 that do not overlap the third gate electrode G3 may be additionally doped. Through this, the third source area S3 and the third drain area D3 having different doping concentrations from the common conductive area SD3 may be formed. However, the embodiment of the present disclosure is not necessarily limited thereto.

Figure 6E:
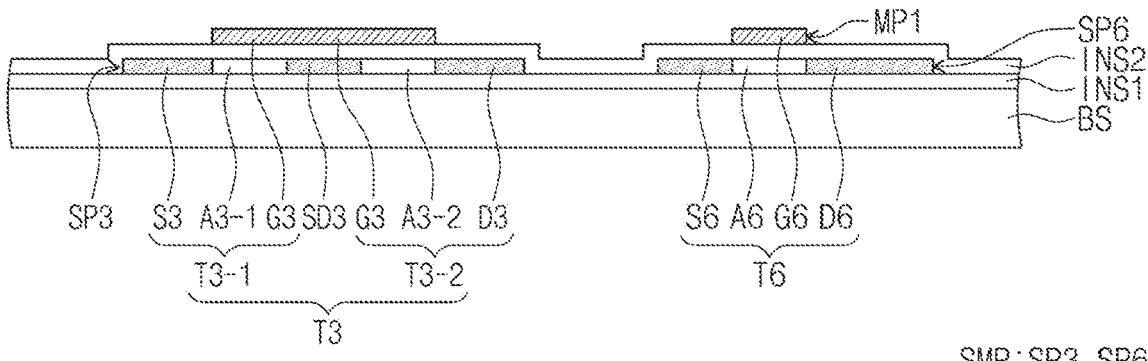

Referring to FIG. 6E, the semiconductor pattern layer SMP including the third semiconductor pattern SP3 and the sixth semiconductor pattern SP6 may be formed. The preliminary sixth semiconductor pattern P-SP6 (refer to FIG. 6D) may be formed as the sixth semiconductor pattern SP6 through a doping process utilizing the sixth gate electrode G6. The sixth semiconductor pattern SP6 may include a sixth source area S6 and a sixth drain area D6 doped with a dopant and a sixth active area A6 overlapping the sixth gate electrode G6 and undoped with a dopant.

According to an embodiment, the common conductive area SD3 located between the plurality of active areas A3-1 and A3-2 may be formed through a doping process utilizing the second photoresist layer PR2 patterned utilizing the second mask MK2a including the half-transmissive area HTA. According to an embodiment, the source area S6 and the drain area D6 spaced apart with a single active area A6 therebetween may not be formed in an operation of forming the common conductive area SD3 and may be formed through a doping process utilizing the sixth gate electrode G6.

In some embodiments, FIGS. 5A to 5F and FIGS. 6A to 6E exemplarily show the operations of forming the third transistor T3 and the sixth transistor T6, but corresponding operations may be equally applied to the above-described plurality of transistors (e.g., first to eighth transistors T1 to T8). For example, the fourth transistor T4 including the plurality of active areas A4-1 and A4-2 may be formed through the same forming operations as those of the third transistor T3, and transistors including a single active area may be formed through the same forming operations as those of the sixth transistor T6.

Thereafter, a display apparatus according to an embodiment of the present disclosure may be manufactured through a process of forming a plurality of insulating layers, connection electrodes, and a light emitting element on the transistors.

Using the display apparatus manufacturing method according to an embodiment of the present disclosure, a transistor may be manufactured having a plurality of active areas, a common conductive area positioned between the plurality of active areas, and a gate electrode overlapping the plurality of active areas and the common conductive area. Through this, it is possible to manufacture a display apparatus including a pixel for improving display quality. The plurality of active areas spaced apart with the common conductive area therebetween may be manufactured utilizing a mask including a half-transmissive area and a photoresist layer.

According to an embodiment, in the operation of manufacturing a transistor having a plurality of active areas, a transistor having one active area may be manufactured together without adding a process. Accordingly, it is possible to manufacture a display apparatus including a pixel for improving display quality through a simplified process.

Pixels according to an embodiment of the present disclosure may include a transistor having a plurality of active areas and a gate electrode overlapping the plurality of active areas. The plurality of active areas may be connected on the same layer with a common conductive area therebetween, and the gate electrode may overlap the plurality of active areas and the common conductive area. Thereby, floating nodes occurring in the common conductive area may be eliminated, and the instantaneous voltage rise between the plurality of active areas is prevented or reduced when the transistor is switched on and off such that the display quality of the display apparatus may be improved.

Although the embodiments of the present disclosure have been described, it is understood that the present disclosure should not be limited to these embodiments but one or more suitable changes and modifications may be made by one ordinary skilled in the art within the spirit and scope of the present disclosure as hereinafter claimed and equivalents thereof.

What is claimed is:

1. A pixel comprising:
   a capacitor connected to a first voltage line;
   a light emitting element connected to a second voltage line;
   a first transistor comprising a first gate electrode connected to the capacitor;
   a second transistor connected to a data line and comprising a second gate electrode connected to a first scan line;
   a third transistor comprising a third gate electrode connected to a second scan line; and
   a fourth transistor comprising a fourth gate electrode connected to a third scan line,
   wherein at least one of the third transistor or the fourth transistor comprises a plurality of active areas spaced apart from each other with a common conductive area therebetween,
   wherein at least one of the third gate electrode or the fourth gate electrode is formed as a single continuous conductive layer overlapping each of an entirety of the common conductive area and the plurality of active areas in a plan view, and
   wherein the common conductive area and the plurality of active areas are defined in a same continuous semiconductor pattern such that the common conductive area is in direct contact with each of the plurality of active areas.

2. The pixel of claim 1, wherein the first transistor comprises a first electrode connected to the first voltage line and a second electrode connected to the light emitting element,
   wherein the second transistor comprises a first electrode connected to the data line and a second electrode connected to the first electrode of the first transistor.

3. The pixel of claim 2, wherein the third transistor comprises:
   a first common conductive area;
   a plurality of active areas spaced apart from each other with the first common conductive area therebetween;
   a first electrode connected to the first gate electrode; and
   a second electrode connected to the second electrode of the first transistor, wherein the first electrode and the second electrode of the third transistor are spaced apart from each other with the plurality of active areas therebetween.

4. The pixel of claim 3, wherein the third gate electrode overlaps the plurality of active areas and the first common conductive area in a plan view.

5. The pixel of claim 1, wherein the third transistor and the fourth transistor are P-type transistors.

6. The pixel of claim 1, wherein the first scan line and the second scan line are integrally provided and are configured to transmit the same first scan signal.

7. The pixel of claim 1, wherein the first scan line and the second scan line are configured to transmit a first scan signal and a second scan signal that are distinct from each other, respectively.

8. The pixel of claim 1, wherein the fourth transistor comprises:
   a second common conductive area;
   a plurality of active areas spaced apart from each other with the second common conductive area therebetween;
   a first electrode connected to the first gate electrode; and
   a second electrode connected to a third voltage line for transmitting an initialization voltage,
   wherein the first electrode and the second electrode of the fourth transistor are spaced apart from each other with the plurality of active areas therebetween.

9. The pixel of claim 8, wherein the fourth gate electrode overlaps the plurality of active areas and the second common conductive area in a plan view.

10. The pixel of claim 1, further comprising:
   a fifth transistor comprising a fifth gate electrode connected to an emission control line and electrically connected between the first voltage line and the first transistor; and
   a sixth transistor comprising a sixth gate electrode connected to the emission control line and electrically connected between the first transistor and the light emitting element.

11. The pixel of claim 10, further comprising a seventh transistor comprising a seventh gate electrode connected to the third scan line and electrically connected between a third voltage line transmitting an initialization voltage and the sixth transistor.

12. The pixel of claim 10, further comprising:
   a seventh transistor comprising a seventh gate electrode connected to a fourth scan line and electrically connected between a third voltage line transmitting an initialization voltage and the sixth transistor; and
   an eighth transistor comprising an eighth gate electrode connected to the fourth scan line and electrically connected between a fourth voltage line transmitting a bias voltage and the second transistor.

13. A display apparatus comprising a plurality of pixels, wherein each of the plurality of pixels comprises:
   a capacitor electrically connected to a first voltage line;
   a light emitting element electrically connected to a second voltage line;
   a driving transistor comprising a gate electrode connected to the capacitor and electrically connected between the first voltage line and the light emitting element;
   a switching transistor electrically connected between a data line and the driving transistor;

a compensation transistor electrically connected between the gate electrode of the driving transistor and a semiconductor pattern of the driving transistor; and
   an initialization transistor electrically connected between the compensation transistor and a third voltage line,
   wherein at least one of the compensation transistor or the initialization transistor comprises:
      a plurality of active areas spaced apart from each other with a common conductive area therebetween; and
      a gate electrode overlapping the common conductive area and the plurality of active areas in a plan view.

14. The display apparatus of claim 13, wherein each of the plurality of active areas comprises polysilicon.

15. The display apparatus of claim 13, wherein the compensation transistor comprises a semiconductor pattern and a gate electrode on the semiconductor pattern,
   wherein the semiconductor pattern of the compensation transistor comprises:
      a common conductive area;
      a plurality of active areas spaced apart from each other with the common conductive area therebetween; and
      a source area and a drain area spaced apart between the plurality of active areas,
   wherein each of the common conductive area, the source area, and the drain area of the compensation transistor is doped with a dopant,
   wherein the gate electrode of the compensation transistor overlaps the plurality of active areas and the common conductive area in a plan view.

16. The display apparatus of claim 15, wherein the gate electrode of the compensation transistor does not overlap the source area and the drain area in a plan view.

17. The display apparatus of claim 15, wherein a doping concentration of each of the common conductive area, the source area, and the drain area is equal to each other.

18. The display apparatus of claim 15, wherein doping concentrations of the common conductive area, the source area, and the drain area are different from each other.

19. The display apparatus of claim 15, wherein a doping concentration of the common conductive area is smaller than a doping concentration of each of the source area and the drain area.

20. A method of manufacturing a display apparatus, the method comprising:
   forming a preliminary semiconductor pattern on a base substrate;
   forming a photoresist layer on the preliminary semiconductor pattern;
   forming a photoresist pattern overlapping a half-transmissive area from the photoresist layer by providing a mask comprising a transmissive area and the half-transmissive area on the photoresist layer;
   forming a first semiconductor pattern and a second semiconductor pattern by doping the preliminary semiconductor pattern; and
   forming a first gate electrode and a second gate electrode on the first semiconductor pattern and the second semiconductor pattern, respectively,
   wherein the first semiconductor pattern comprises a plurality of first active areas corresponding to the photoresist pattern and overlapping the first gate electrode,
   wherein the second semiconductor pattern comprises a second active area corresponding to the photoresist pattern and overlapping the second gate electrode.

* * * * *